United States Patent
Moon et al.

(10) Patent No.: US 12,168,823 B2
(45) Date of Patent: Dec. 17, 2024

(54) MASK ASSEMBLY, MASK MANUFACTURED USING THE SAME, AND METHOD OF MANUFACTURING DISPLAY PANEL

(71) Applicant: Samsung Display Co., Ltd., Yongin-Si (KR)

(72) Inventors: Youngmin Moon, Yongin-si (KR); Minho Moon, Seongnam-si (KR); Sungsoon Im, Suwon-si (KR); Junho Jo, Seoul (KR); Seungyong Song, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 622 days.

(21) Appl. No.: 17/217,489

(22) Filed: Mar. 30, 2021

(65) Prior Publication Data
US 2022/0010421 A1    Jan. 13, 2022

(30) Foreign Application Priority Data
Jul. 7, 2020 (KR) .................. 10-2020-0083478

(51) Int. Cl.
*H10K 71/16* (2023.01)
*C23C 14/04* (2006.01)
(Continued)

(52) U.S. Cl.
CPC ........... *C23C 14/042* (2013.01); *H10K 71/00* (2023.02); *H10K 71/166* (2023.02); *C23C 14/24* (2013.01)

(58) Field of Classification Search
CPC .... C23C 14/042; C23C 14/24; H10K 71/166; H10K 71/00
See application file for complete search history.

(56) References Cited

U.S. PATENT DOCUMENTS 6,858,086 B2    2/2005  Kang
7,537,798 B2    5/2009  Shigemura
(Continued)

FOREIGN PATENT DOCUMENTS

KR    1020040045284 A    6/2004
KR    100490534 B1    5/2005
(Continued)

*Primary Examiner* — David Vu
*Assistant Examiner* — Brandon C Fox
(74) *Attorney, Agent, or Firm* — CANTOR COLBURN LLP

(57) ABSTRACT

A mask assembly includes a mask frame through which a plurality of openings is defined and a plurality of cell masks disposed to respectively correspond to the cell openings. Each of the cell masks includes a mask main body substantially parallel to a plane defined by a first direction and a second direction crossing the first direction, where a plurality of holes is defined through the mask main body, a bonding portion disposed along an edge of the mask main body, and a tensile portion extending from the bonding portion and disposed spaced apart from the mask main body. The tensile portion includes first tensile portions spaced apart from each other in the first direction and disposed at opposite sides of the mask main body and second tensile portions spaced apart from each other in the second direction and disposed at opposite sides of the mask main body.

22 Claims, 18 Drawing Sheets

(51) Int. Cl.
*H10K 71/00* (2023.01)
*C23C 14/24* (2006.01)

(56) References Cited

U.S. PATENT DOCUMENTS

| | | | | |
|---|---|---|---|---|
| 8,915,213 | B2 * | 12/2014 | Park | C23C 14/042 |
| | | | | 118/721 |
| 10,934,614 | B2 * | 3/2021 | Sakio | C23C 14/042 |
| 11,214,858 | B2 * | 1/2022 | Jin | C23C 14/042 |
| 11,939,657 | B2 | 3/2024 | Ha et al. | |
| 2016/0043319 | A1 * | 2/2016 | White | H10K 71/191 |
| | | | | 359/230 |
| 2019/0368025 | A1 * | 12/2019 | Kim | C23C 14/042 |
| 2019/0378984 | A1 | 12/2019 | Nakamura et al. | |
| 2020/0152463 | A1 | 5/2020 | Ushikusa et al. | |
| 2021/0343760 | A1 * | 11/2021 | Jo | H01L 27/1288 |

FOREIGN PATENT DOCUMENTS

| | | | | | |
|---|---|---|---|---|---|
| KR | 1020150088192 | A | | 7/2015 | |
| KR | 101579910 | A1 * | 12/2015 | | H01L 51/56 |
| KR | 101867467 | B1 | | 6/2018 | |
| KR | 1020190089074 | A | | 7/2019 | |
| KR | 1020190090177 | A | | 8/2019 | |
| KR | 1020200026280 | A | | 3/2020 | |
| KR | 1020200030712 | A | | 3/2020 | |

\* cited by examiner

MASK ASSEMBLY, MASK MANUFACTURED USING THE SAME, AND METHOD OF MANUFACTURING DISPLAY PANEL

This application claims priority to Korean Patent Application No. 10-2020-0083478, filed on Jul. 7, 2020, and all the benefits accruing therefrom under 35 U.S.C. § 119, the content of which in its entirety is herein incorporated by reference.

BACKGROUND

1. Field

The disclosure relates to a mask assembly, a mask manufactured using the mask assembly and a method of manufacturing a display panel using the mask. More particularly, the disclosure relates to a mask having improved process yield and reliability, a mask assembly used to manufacture the mask, and a method of manufacturing a display panel using the mask.

2. Description of the Related Art

A display panel typically includes a plurality of pixels. Each of the pixels may include a driving element, such as a transistor, and a display element, such as an organic light emitting diode. The display element may be formed by stacking an electrode and a light emission pattern on a substrate.

The light emission pattern may be patterned using a mask through which holes are defined, and thus, the light emission pattern is formed in predetermined areas exposed through the holes. The light emission pattern may have a shape determined by a shape of the holes. In recent years, technologies for a manufacturing equipment and a manufacturing method for a large-area mask are being developed to increase a production yield of the display panel including the light emission pattern.

SUMMARY

The disclosure provides a mask assembly that is used to manufacture a large-area mask for a large-sized display panel and with improved reliability and quality.

The disclosure provides the mask manufactured using the mask assembly.

The disclosure provides a method of manufacturing the display panel using the mask.

An embodiment of the invention provides a mask assembly including a mask frame through which a plurality of cell openings is defined and a plurality of cell masks disposed to respectively correspond to the cell openings. In such an embodiment, each of the cell masks includes a mask main body substantially parallel to a plane defined by a first direction and a second direction crossing the first direction, where a plurality of holes is defined through the mask main body, a bonding portion disposed along an edge of the mask main body, and a tensile portion extending from the bonding portion and disposed spaced apart from the mask main body. In such an embodiment, the tensile portion includes first tensile portions spaced apart from each other in the first direction and disposed at opposite sides of the mask main body and second tensile portions spaced apart from each other in the second direction and disposed at opposite sides of the mask main body.

In an embodiment, the first tensile portions may include first and second side tensile portions disposed at the opposite sides of the mask main body, which face each other in the first direction, and the second tensile portions may include third and fourth side tensile portions disposed at the opposite sides of the mask main body, which face each other in the second direction.

In an embodiment, the tensile portion may include a plurality of convex portions protruding to a direction being away from the mask main body and a concave portion defined between the convex portions and concave toward the mask main body.

In an embodiment, each of the cell masks may include a recess portion defined between the first tensile portions and the second tensile portions and recessed toward the mask main body.

In an embodiment, each of the cell masks may include a round portion connecting the first tensile portions to the second tensile portions.

In an embodiment, the cell openings of the mask frame may include a first cell opening and a second cell opening having a size different from a size of the first cell opening when viewed in a plane.

In an embodiment, the cell masks may include a first cell mask having an area corresponding to the first cell opening in a plane and a second cell mask having an area corresponding to the second cell opening in a plane.

In an embodiment, at least a portion of the bonding portion may have a thickness smaller than a thickness of the mask main body and a thickness of the tensile portion.

In an embodiment, the bonding portion may include a plurality of half-etching patterns having a thickness smaller than a thickness of the mask main body and a thickness of the tensile portion.

In an embodiment, each of the cell masks may include a plurality of cell areas each through which the holes are defined and an extension area defined between the cell areas.

In an embodiment, the mask frame may include a bonding area defined along an edge of the cell openings.

In an embodiment, the cell openings may be arranged in at least one direction selected from the first and second directions to be spaced apart from each other.

In an embodiment, the mask frame may include a support area defined between the cell openings.

An embodiment of the invention provides a mask including a mask frame, through which a plurality of cell openings is defined, and a plurality of unit masks bonded to the mask frame to respectively correspond to the cell openings. In such an embodiment, each of the unit masks includes a mask main body including first and second sides facing each other in a first direction and extending in a second direction crossing the first direction and third and fourth sides facing each other in the second direction and extending in the first direction, where a plurality of holes is defined through the mask main body, and a bonding portion defined along an edge of the mask main body. In such an embodiment, the mask main body of each of the cell masks receives a first tensile force in the first direction and a second tensile force in the second direction.

In an embodiment, the bonding portion may include a first bonding portion disposed adjacent to the first side, a second bonding portion disposed adjacent to the second side, a third bonding portion disposed adjacent to the third side, and a fourth bonding portion disposed adjacent to the fourth side, and each of the first, second, third, and fourth bonding portions may be bonded to the mask frame.

In an embodiment, each of the first, second, third, and fourth bonding portions may include a metal oxide.

An embodiment of the invention provides a method of manufacturing a display panel including preparing a target substrate, forming a mask through which a plurality of holes is defined to place the mask under the target substrate, forming a plurality of patterns corresponding to the holes, and removing the mask. In such an embodiment, the forming the mask includes preparing a mask frame, through which a plurality of cell openings is defined, and coupling cell masks to respectively correspond to the cell openings. In such an embodiment, each of the cell masks includes a mask main body substantially parallel to a plane defined by a first direction and a second direction crossing the first direction, where the holes are defined through the mask main body, a bonding portion disposed along an edge of the mask main body, and a tensile portion extending from the bonding portion and disposed spaced apart from the mask main body. In such an embodiment, the tensile portion includes first tensile portions spaced apart from each other in the first direction and disposed at opposite sides of the mask main body and second tensile portions spaced apart from each other in the second direction and disposed at opposite sides of the mask main body.

In an embodiment, the coupling the cell masks may include disposing the cell masks respectively corresponding to the cell openings, radiating a laser beam to the bonding portion of each of the cell masks to bond the mask frame to the cell masks, and removing the tensile portion.

In an embodiment, the coupling the cell masks may further include tensioning the cell masks to correspond to the cell openings before disposing the cell masks.

In an embodiment, the mask frame may include a bonding area defined along an edge of each of the cell openings, and the laser beam may be radiated between the bonding portion and the bonding area in the bonding of the mask frame and the cell masks.

In an embodiment, the cell openings may include a first cell opening and a second cell opening having a size different from a size of the first cell opening in a plane, and the cell masks may include a first cell mask coupled to correspond to the first cell opening and a second cell mask coupled to correspond to the second cell opening.

In an embodiment, the patterns may be light emitting patterns including a light emitting material.

According to embodiments, the deterioration in reliability and quality of the mask caused by a contraction of the cell mask may be effectively prevented since the cell mask is tensioned in both directions while a large-area mask is manufactured using the cell mask. Accordingly, a large-sized display panel with improved display quality may be manufactured using the mask assembly.

BRIEF DESCRIPTION OF THE DRAWINGS

The above and other features of the disclosure will become readily apparent by reference to the following detailed description when considered in conjunction with the accompanying drawings, in which.

DETAILED DESCRIPTION

Figure 1:
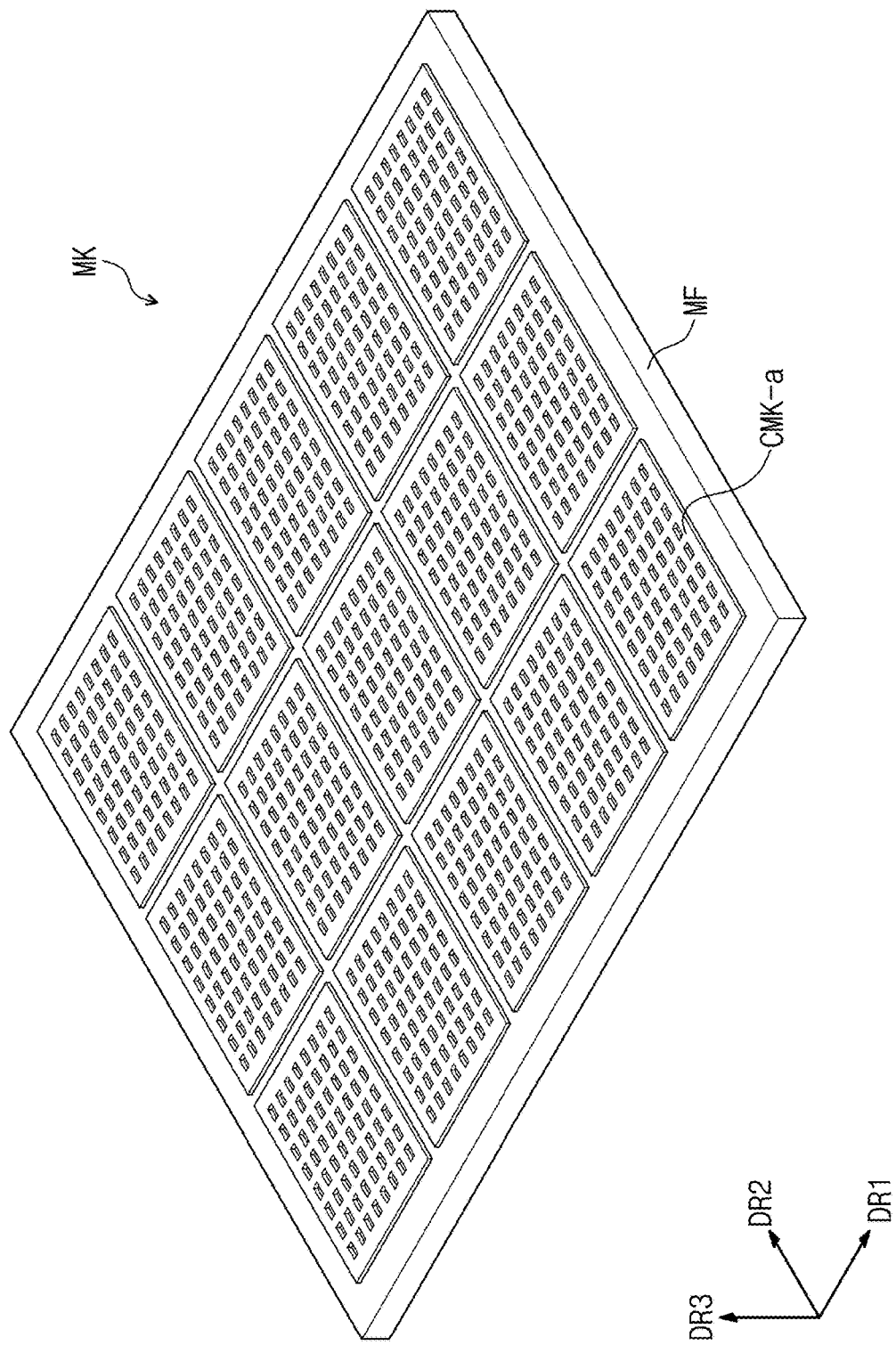
FIGS. 1 and 2 are perspective views showing a mask manufactured by a mask assembly according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of a mask and a mask assembly will be described in detail with reference to the accompanying drawings.

Figure 2:
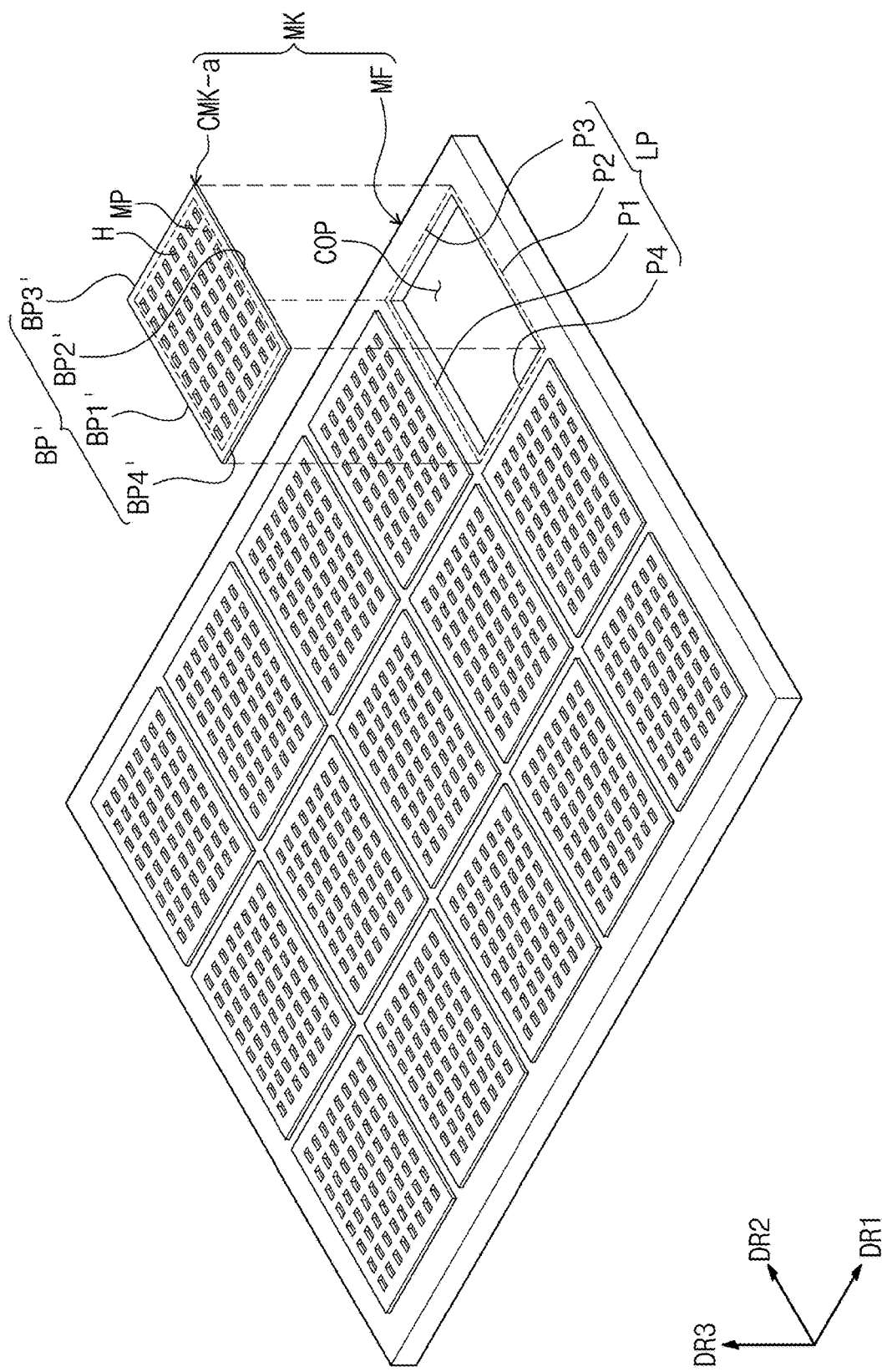

FIGS. 1 and 2 are perspective views showing a mask manufactured by a mask assembly according to an embodiment of the disclosure. For the convenience of illustration and description, FIG. 2 shows one unit mask CMK-a separated from a mask frame MF.

Referring to FIGS. 1 and 2, an embodiment of the mask MK may be used for a manufacturing process of a display device. In such an embodiment, the mask MK may be used for a process of depositing a light emission pattern of a light emitting element on a deposition substrate of the display device.

The mask MK may have a cuboid shape. In one embodiment, for example, the mask MK may include two long sides extending in a first direction DR1 and two short sides extending in a second direction DR2. The second direction DR2 indicates a direction crossing the first direction DR1.

The mask MK may be a plate with thin thickness in a third direction DR3. The third direction DR3 may indicate a direction substantially vertically crossing a plane defined by the first direction DR1 and the second direction DR2. Hereinafter, in the disclosure, the expression "when viewed in a plane" may mean a state of being viewed in the third direction DR3.

The mask MK may include the mask frame MF and a plurality of unit masks CMK-a. The mask frame MF and the unit masks CMK-a may include a metal material, such as a stainless steel ("SUS"), an Invar alloy, nickel (Ni), or cobalt (Co). In one embodiment, for example, the mask frame MF and the unit masks CMK-a may include the Invar alloy. However, the material for the mask frame MF and the unit masks CMK-a are not limited thereto or thereby. In one alternative embodiment, for example, the mask frame MF and the unit masks CMK-a may include a polyimide-based material to reduce weight of members.

The mask frame MF may have a quadrangular shape defined by long sides extending in the first direction DR1 and short sides extending in the second direction DR2. A plurality of cell openings COP may be defined through the mask frame MF. The cell openings COP may be arranged in at least one of the first direction DR1 and the second direction DR2. The cell openings COP may be arranged in a matrix form along the first direction DR1 and the second direction DR2.

When viewed in a plane, each of the cell openings COP may have a quadrangular shape. In one embodiment, for example, each cell opening COP may be defined by two long sides spaced apart from each other in the first direction DR1 and extending in the second direction DR2 and two short sides spaced apart from each other in the second direction DR2 and extending in the first direction DR1. The cell openings COP may be defined through the mask frame MF in the third direction DR3.

FIGS. 1 and 2 show an embodiment where fifteen cell openings COP are defined in the mask frame MF, however, this is merely exemplary. Alternatively, the number of the cell openings COP may be more or less than fifteen. In such an embodiment, the shape of each cell opening COP may be variously modified to correspond to a shape of the unit mask CMK-a described below.

A support area SP (refer to FIG. 3) may be disposed between the cell openings COP defined through the mask frame MF. The mask MK may have an integral plate shape defined by the unit masks CMK-a respectively disposed in the cell openings COP and the support area SP disposed between the cell openings COP and connecting the cell openings COP.

When viewed in a plane, the unit masks CMK-a may respectively overlap the cell openings COP. When viewed in a plane, each of the unit masks CMK-a may have a quadrangular shape.

Each of the unit masks CMK-a may include a mask main body MP and a bonding portion BP'. In an embodiment, a plurality of holes H are defined through the mask main body MP. The holes H may be defined through the unit masks CMK-a in the third direction DR3. The bonding portion BP' may extend from the mask main body MP in the first direction DR1 and the second direction DR2. When viewed in a plane, the bonding portion BP' may have a quadrangular ring shape and may be disposed along an edge of the mask main body MP. The bonding portion BP' may include a first bonding portion BP1', a second bonding portion BP2', a third bonding portion BP3', and a fourth bonding portion BP4'.

The unit masks CMK-a may be disposed on the mask frame MF. In an embodiment, each of the unit masks CMK-a may be disposed in a corresponding cell opening COP among the cell openings COP. In such an embodiment, an n-th unit mask CMK-a may be disposed in an n-th cell opening COP.

When viewed in a plane, the mask main body MP of the unit mask CMK-a may have a size that is the same as that of the cell opening COP. The bonding portion BP' of the unit mask CMK-a may be disposed on an edge portion LP of the mask frame MF. The edge portion LP may correspond to a portion of the mask frame MF around each of the cell openings COP. The edge portion LP may have a quadrangular ring shape in a plane.

The unit masks CMK-a may be fixed to the mask frame MF. In an embodiment, the bonding portion BP' of the unit masks CMK-a may be fixed to a corresponding edge portion LP. In one embodiment, for example, a welding process may be performed between first, second, third, and fourth portions P1, P2, P3, and P4 of the edge portion LP and portions of the bonding portion BP' corresponding to the first, second, third, and fourth portions P1, P2, P3, and P4. In an embodiment, the edge portion LP may be a portion bonded to the corresponding bonding portion BP' by the welding process. In such an embodiment, a bonding pattern used to bond the bonding portion BP' to the mask frame MF may be formed on the bonding portion BP'. The bonding pattern used to bond first, second, third, and fourth bonding portions BP1', BP2', and BP3', and BP4' to the mask frame MF may be formed on each of the first, second, third, and fourth bonding portions BP1', BP2', and BP3', and BP4'. The bonding pattern may have a quadrangular ring shape extending in the form of a solid line along the edge of the mask main body MP of the unit mask CMK-a. Alternatively, the bonding pattern may be provided in plural in each of the first, second, third, and fourth bonding portions BP1', BP2', and BP3', and BP4', and the bonding patterns may be spaced apart from each other at regular intervals to have a quadrangular ring shape extending in the form of a dotted-line line along the edge of the mask main body MP. The bonding between the mask frame MF and the unit mask CMK-a will be described in detail later.

Figure 3:
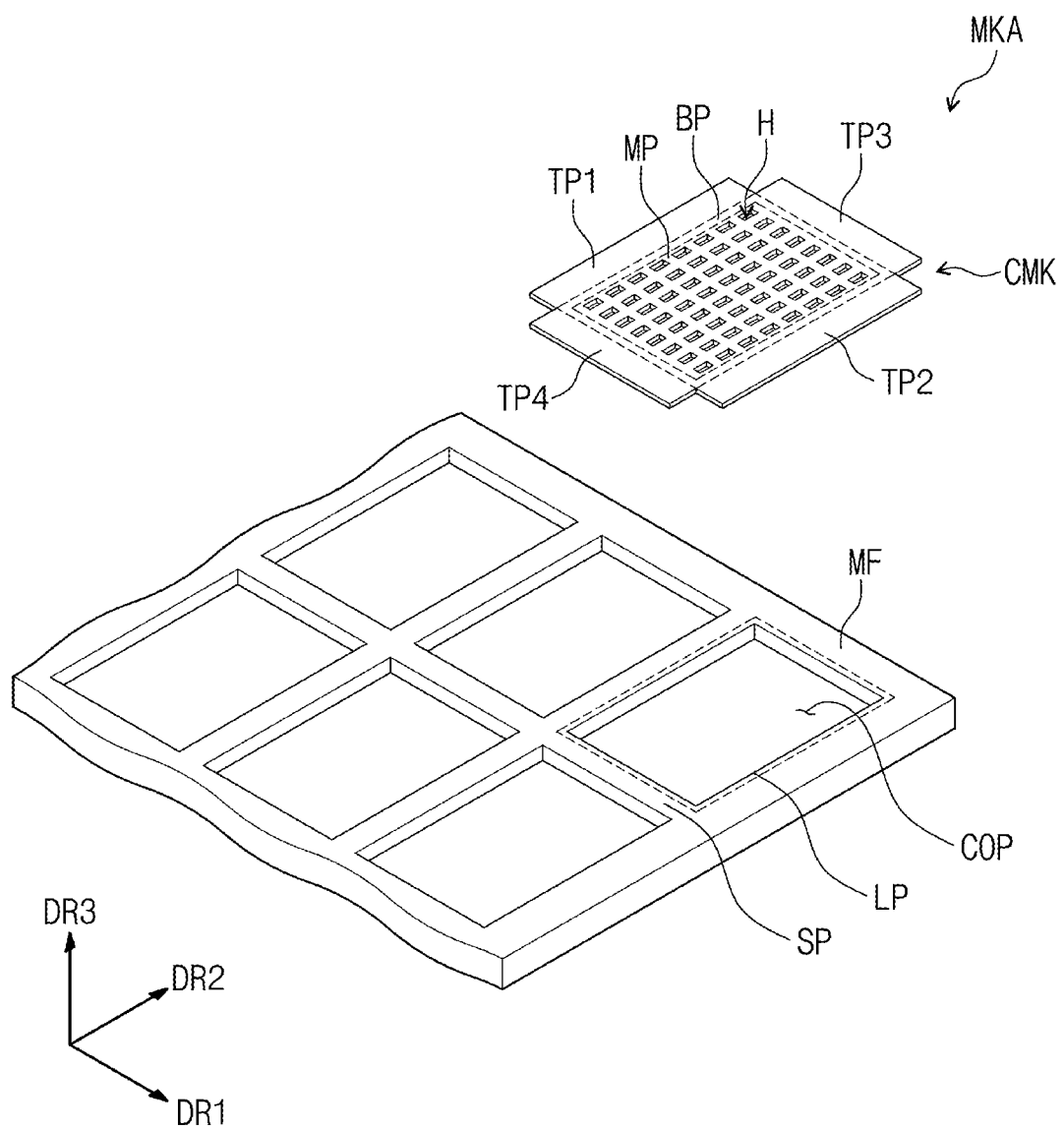
FIG. 3 is a perspective view showing a mask assembly according to an embodiment of the disclosure.
Figure 4:
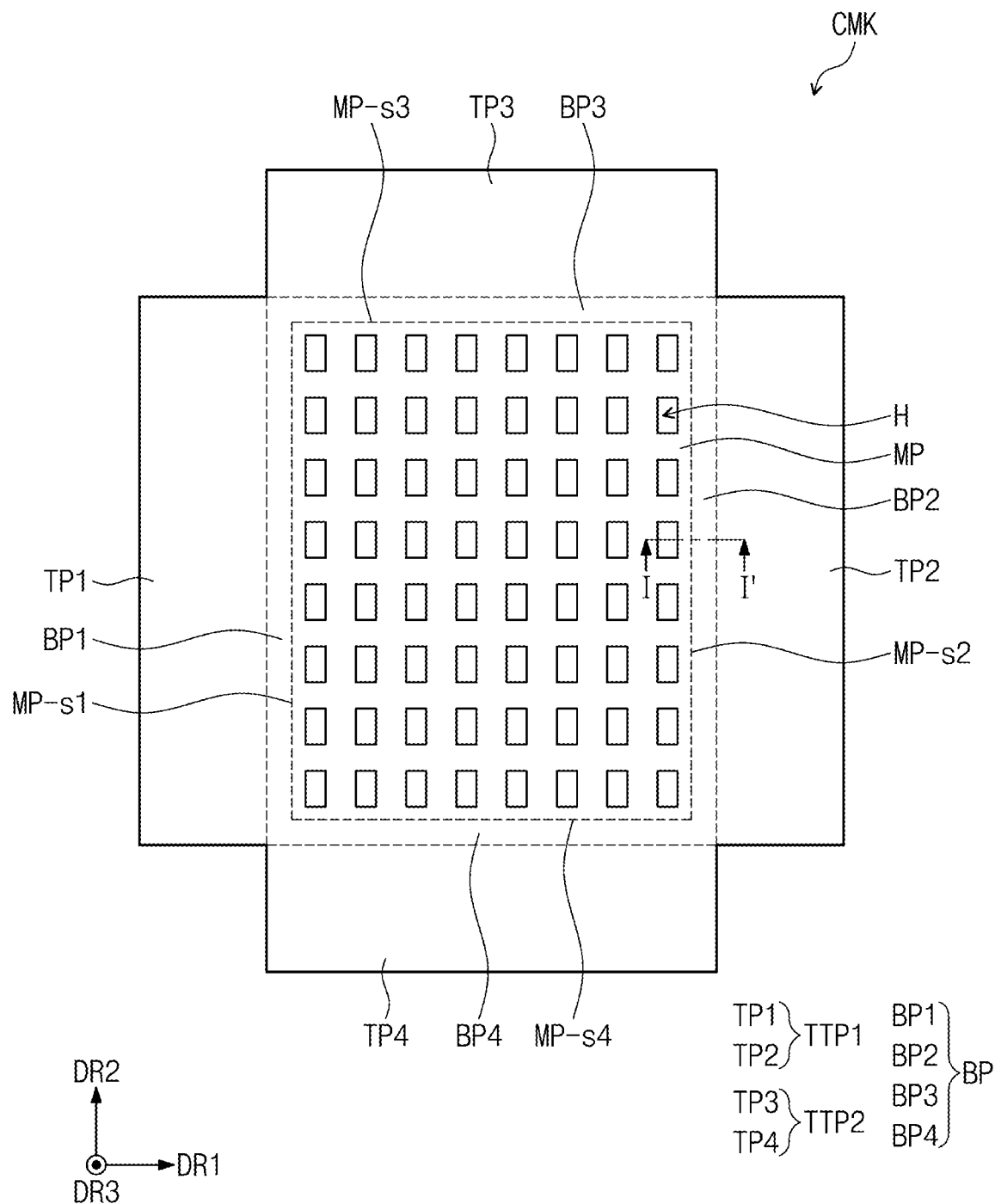
FIG. 4 is a plan view showing a cell mask according to an exemplary embodiment of the disclosure.
Figure 5:
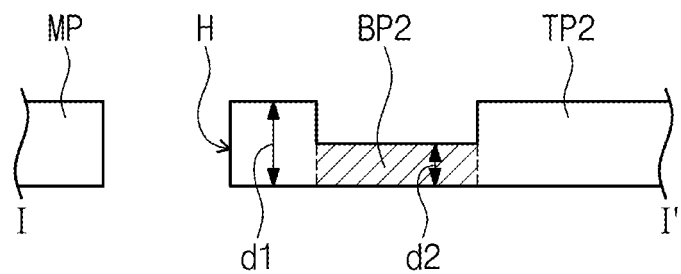
FIG. 5 is a cross-sectional view showing a portion of a cell mask according to an embodiment of the disclosure.

FIG. 3 is a perspective view showing a mask assembly MKA according to an embodiment of the disclosure. FIG. 4 is a plan view showing a cell mask CMK according to an embodiment of the disclosure. FIG. 5 is a cross-sectional view showing a portion of the cell mask CMK according to an embodiment of the disclosure. FIG. 5 shows a cross-section taken along line I-I' shown in FIG. 4.

Referring to FIGS. 1 to 3, an embodiment of the mask assembly MKA may include a mask frame MF and a plurality of cell masks CMK disposed in a plurality of cell openings COP defined through the mask frame MF. For the convenience of illustration and description, FIG. 3 shows one cell mask CMK corresponding to one cell opening COP among the cell openings COP defined through the mask frame MF, but not being limited thereto. Alternatively, the mask assembly MKA may include a plurality of cell masks CMK respectively corresponding to one cell opening COP among the cell openings COP defined through the mask frame MF. In an embodiment of the mask MK shown in FIG. 1, the unit masks CMK-a may be formed by respectively bonding the cell masks CMK to corresponding cell openings COP and removing a portion of the cell masks CMK, which will be described in greater detail later.

Referring to FIGS. 3 and 4, each of the cell masks CMK included in the mask assembly MKA may include a mask main body MP, a bonding portion BP, and tensile portions TTP1 and TTP2.

The mask main body MP may have a plate shape substantially parallel to a plane defined by the first direction DR1 and the second direction DR2. The mask main body MP may have a rectangular shape substantially parallel to the plane defined by the first direction DR1 and the second direction DR2. The mask main body MP may include two long sides spaced apart from each other in the first direction DR1 and extending in the second direction DR2 and two short sides spaced apart from each other in the second direction DR2 and extending in the first direction DR1. The mask main body MP may include first and second sides MP-s1 and MP-s2 spaced apart from each other in the first direction DR1 and extending in the second direction DR2 and third and fourth sides MP-s3 and MP-s4 spaced apart from each other in the second direction DR2 and extending in the first direction DR1. The mask main body MP may have a shape corresponding to that of one of the cell openings COP defined through the mask frame MF. The mask main body MP may be provided with the holes H defined therethrough. The holes H may be defined through the cell masks CMK in the third direction DR3.

The bonding portion BP may be disposed to surround an edge of the mask main body MP. The bonding portion BP may have the quadrangular ring shape extending in the first direction DR1 and the second direction DR2. The bonding portion BP may have the shape corresponding to an edge portion LP defined in the mask frame MF. In an embodiment, as shown in FIG. 4, the bonding portion BP may include a first bonding portion BP1 disposed adjacent to the first side MP-s1, a second bonding portion BP2 disposed adjacent to the second side MP-s2, a third bonding portion BP3 disposed adjacent to the third side MP-s3, and a fourth bonding portion BP4 disposed adjacent to the fourth side MP-s4.

The tensile portions TTP1 and TTP2 may extend from the bonding portion BP and may be spaced apart from the mask main body MP with the bonding portion BP interposed therebetween. The tensile portions TTP1 and TTP2 may include four tensile portions respectively corresponding to four sides of the mask main body having a rectangular shape. The tensile portions TTP1 and TTP2 may include first tensile portions TTP1 disposed to correspond to the long sides of the mask main body MP, which are spaced apart from each other in the first direction DR1 and extend in the second direction DR2, and second tensile portions TTP2 disposed to correspond to the short sides of the mask main body MP, which are spaced apart from each other in the second direction DR2 and extend in the first direction DR1. The first tensile portions TTP1 may include first and second side tensile portions TP1 and TP2 disposed to correspond to the long sides of the mask main body MP, which face each other in the first direction DR1, and the second tensile portions TTP2 may include third and fourth side tensile portions TP3 and TP4 disposed to correspond to the short sides of the mask main body MP, which face each other in the second direction DR2. The first, second, third, and fourth side tensile portions TP1, TP2, TP3, and TP4 may be disposed to respectively correspond to the four sides of the mask main body MP and may extend in a direction being away from the mask main body MP.

Referring to FIGS. 4 and 5, at least a portion of the bonding portion BP of the cell mask CMK may have a thickness different from that of the mask main body MP and the tensile portions TTP1 and TTP2. In an embodiment, the mask main body MP and the tensile portions TTP1 and TTP2 may have a first thickness d1, and the second bonding portion BP2 may have a second thickness d2 less than the first thickness d1. FIG. 5 shows only the second thickness d2 of the second bonding portion BP2 in cross-section, and the first, third, and fourth bonding portions BP1, BP3, and BP4 may have the same thickness as that of the second bonding portion BP2 in cross-section. Herein, the expression "the thicknesses are substantially the same" not only means a case that the thicknesses of the components are the same as each other but also means a case that the thicknesses of the components are the same as each other within a range including differences that may occur due to fabrication errors in spite of the same design. Hereinafter, the thickness of the bonding portion BP will be described as the second thickness d2. The first thickness d1 of the mask main body MP may be equal to or greater than about 1 micrometers and equal to or smaller than about 100 micrometers. The second thickness d2 of the bonding portion BP may correspond to about 40% or more and about 60% or less of the first thickness d1. According to an embodiment, at least a portion of the bonding portion BP may have a thickness reduced by about half through a half-etching process. According to an embodiment, at least a portion of the bonding portion BP may be half-etched when an etching process is performed on the mask main body MP to form the holes H. According to an embodiment, the bonding portion BP may be entirely etched to allow the entire portion of the bonding portion BP to have the thickness equal to or greater than about 40% and equal to or smaller than about 60% of the first thickness d1 of the mask main body MP. In an alternative embodiment, a plurality of half-etching patterns may be defined on the bonding portion BP to be spaced apart from each other, and each of the half-etching patterns may have the thickness equal to or greater than about 40% and equal to or smaller than about 60% of the first thickness d1 of the mask main body MP. In such an embodiment, as the thickness of the bonding portion BP is smaller than the thickness of the mask main body MP and the tensile portions TTP1 and TTP2, a cost and a time for the process may be reduced in a process of bonding the cell mask and a process of removing the tensile portions.

An embodiment of the mask assembly includes the cell masks respectively corresponding to the cell openings, and each of the cell masks includes the tensile portions disposed to respectively correspond to the four sides of the mask main body. If a large-area mask is manufactured using a mask assembly including a cell mask provided with tensile portions disposed on only two sides thereof, a contraction occurs in other sides where the tensile portions are not disposed, and as a result, a reliability and a quality of the mask are deteriorated. According to an embodiment of the invention, the mask assembly may include the cell mask, and the large-area mask applied to manufacture the large-sized display panel may be manufactured. In such an embodiment, the contraction of the four sides of the mask main body may be effectively prevented in the process of tensioning the cell mask due to the tensile portions disposed to correspond to the four sides of the mask main body of the cell mask. Accordingly, deteriorations of the reliability and the quality of the mask may be effectively prevented, and thus, the large-sized display panel with improved display quality may be manufactured.

FIGS. 6 to 9 are plan views showing various embodiments of a cell mask CMK-1, CMK-2, CMK-3, and CMK-4. In such embodiment, at least one selected from a mask main body MP, a bonding portion BP, and tensile portions TTP1 and TTP2 of each of the cell masks CMK-1, CMK-2, CMK-3, and CMK-4 shown in FIGS. 6 to 9 has a different shape from that of the cell mask CMK shown in FIG. 4. In FIGS. 6 to 9, the same reference numerals denote the same element in FIGS. 1 to 5, and thus, any repetitive detailed descriptions of the same elements will be omitted.

Figure 6:
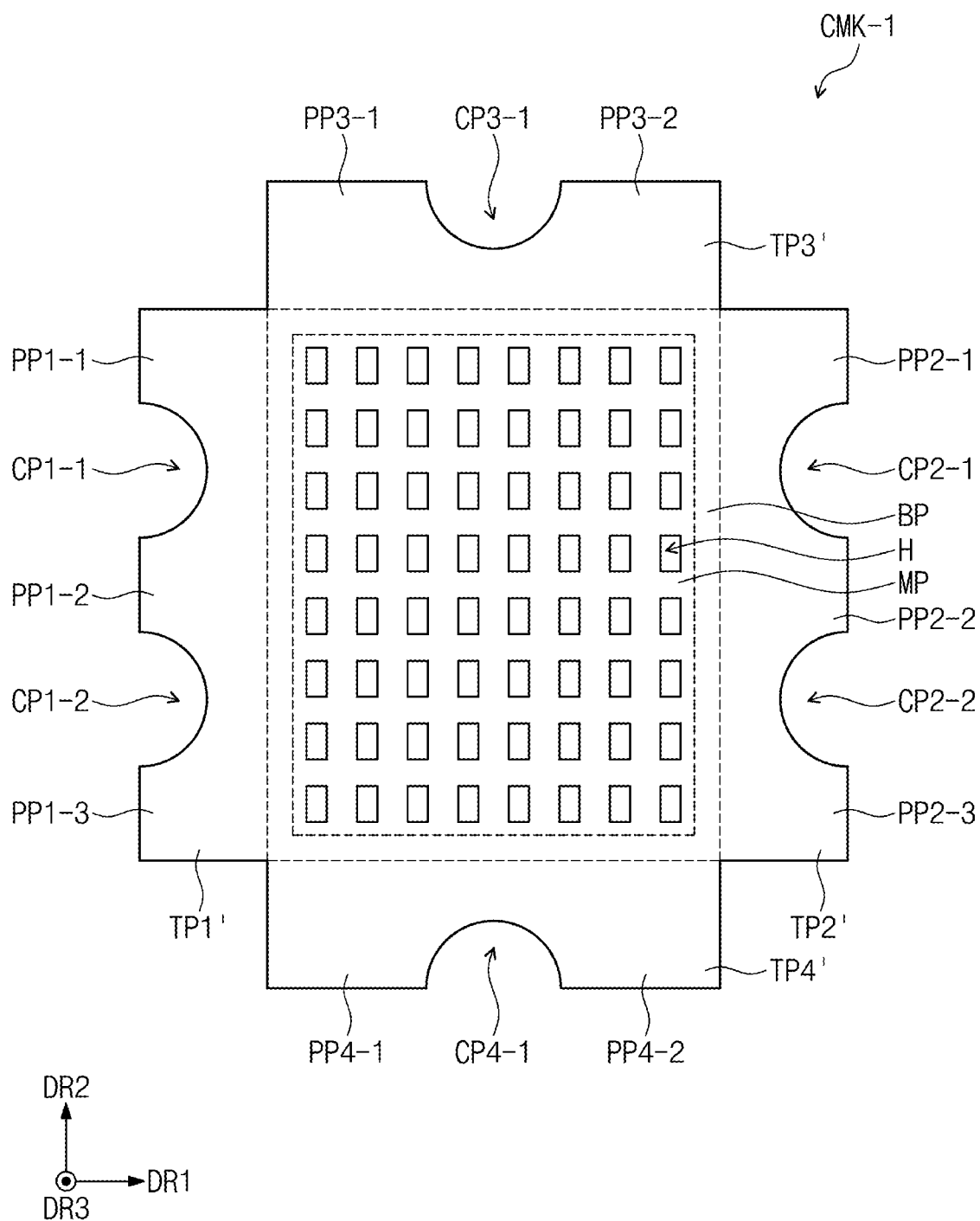
FIGS. 6 to 9 are plan views showing various embodiments of a cell mask.

Referring to FIG. 6, an embodiment of the cell mask CMK-1 may include a convex portion and a concave portion, which are defined in each of tensile portions TP1', TP2', TP3', and TP4' respectively disposed on four sides of the mask main body MP. In such an embodiment, a first side tensile portion TP1' may include convex portions PP1-1, PP1-2, and PP1-3 protruded to a direction being away from the mask main body MP and concave portions CP1-1 and CP1-2 defined between the convex portions PP1-1, PP1-2, and PP1-3 and concave toward the mask main body MP. A second side tensile portion TP2' may include convex portions PP2-1, PP2-2, and PP2-3 protruded to a direction being away from the mask main body MP and concave portions CP2-1 and CP2-2 defined between the convex portions PP2-1, PP2-2, and PP2-3 and concave toward the mask main body MP. A third side tensile portion TP3' may include convex portions PP3-1 and PP3-2 protruded to a direction being away from the mask main body MP and a concave portion CP3-1 defined between the convex portions PP3-1 and PP3-2 and concave toward the mask main body MP. A fourth side tensile portion TP4' may include convex portions PP4-1 and PP4-2 protruded to a direction being away from the mask main body MP and a concave portion CP4-1 defined between the convex portions PP4-1 and PP4-2 and concave toward the mask main body MP. The convex portions respectively disposed on the tensile portions TP1', TP2', TP3', and TP4' may correspond to portions held by clamps included in a mask manufacturing apparatus in a process of tensioning the cell mask CMK-1. In such an embodiment, the clamps included in the mask manufacturing apparatus may hold the convex portions respectively disposed on the tensile portions TP1', TP2', TP3', and TP4', and then, may tension the cell mask CMK-1 in the process of tensioning the cell mask CMK-1. In an embodiment shown in FIG. 6, each of the first and second side tensile portions TP1' and TP2' may include three convex portions and two concave portions, and each of the third and fourth side tensile portions TP3' and TP4' may include two convex portions and one concave portion. However, the disclosure are be limited thereto or thereby, and the number of the convex portions and the number of the concave portions may be variously modified depending on the area of the mask main body MP in a plane and the number of the clamps. In an embodiment as shown in FIG. 6, the concave portion has a semi-circular shape, and the convex portion has a shape corresponding to the concave portion, however, the convex portion and the concave portion may have various shapes without being particularly limited.

Figure 7:
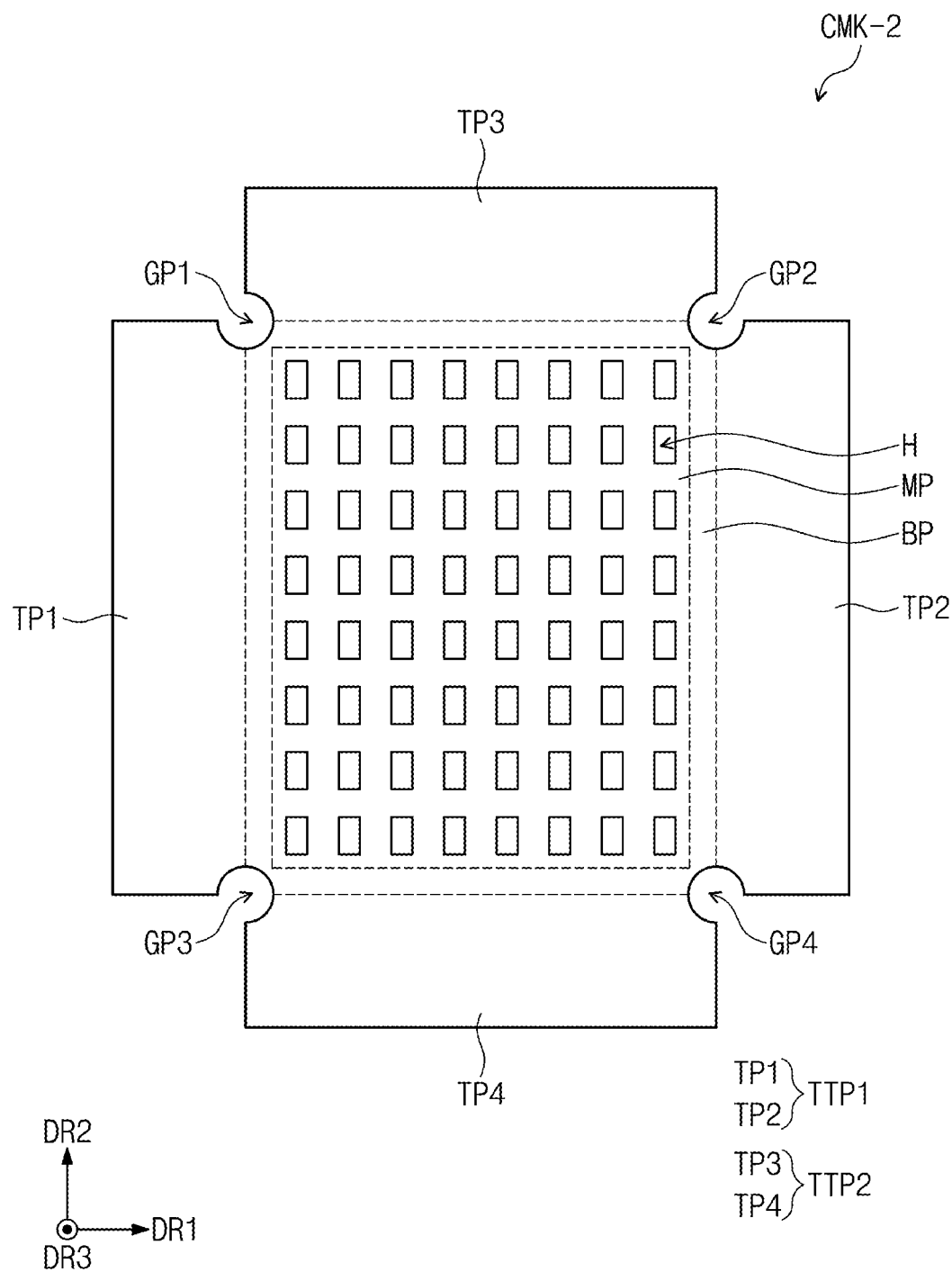

Referring to FIG. 7, an alternative embodiment of the cell mask CMK-2 may include recess portions GP1, GP2, GP3, and GP4 defined between a first tensile portion TTP1 and a second tensile portion TTP2. The recess portions GP1, GP2, GP3, and GP4 may be defined between the first tensile portion TTP1 and the second tensile portion TTP2 and may have a shape recessed to a mask main body MP. The recess portions GP1, GP2, GP3, and GP4 may include a first recess portion GP1 defined between a first side tensile portion TP1 and a third side tensile portions TP3, a second recess portion GP2 defined between a second side tensile portion TP2 and the third side tensile portions TP3, a third recess portion GP3 defined between the first side tensile portion TP1 and a fourth side tensile portions TP4, and a fourth recess portion GP4 defined between the second side tensile portion TP2 and the fourth side tensile portions TP4. In an embodiment, at least one of the first to fourth recess portions GP1 to GP4 may be omitted. In FIG. 7, each of the recess portions GP1, GP2, GP3, and GP4 has a circular shape, but not being limited thereto or thereby. Each of the recess portions GP1, GP2, GP3, and GP4 may have a variety of shapes.

Figure 8:
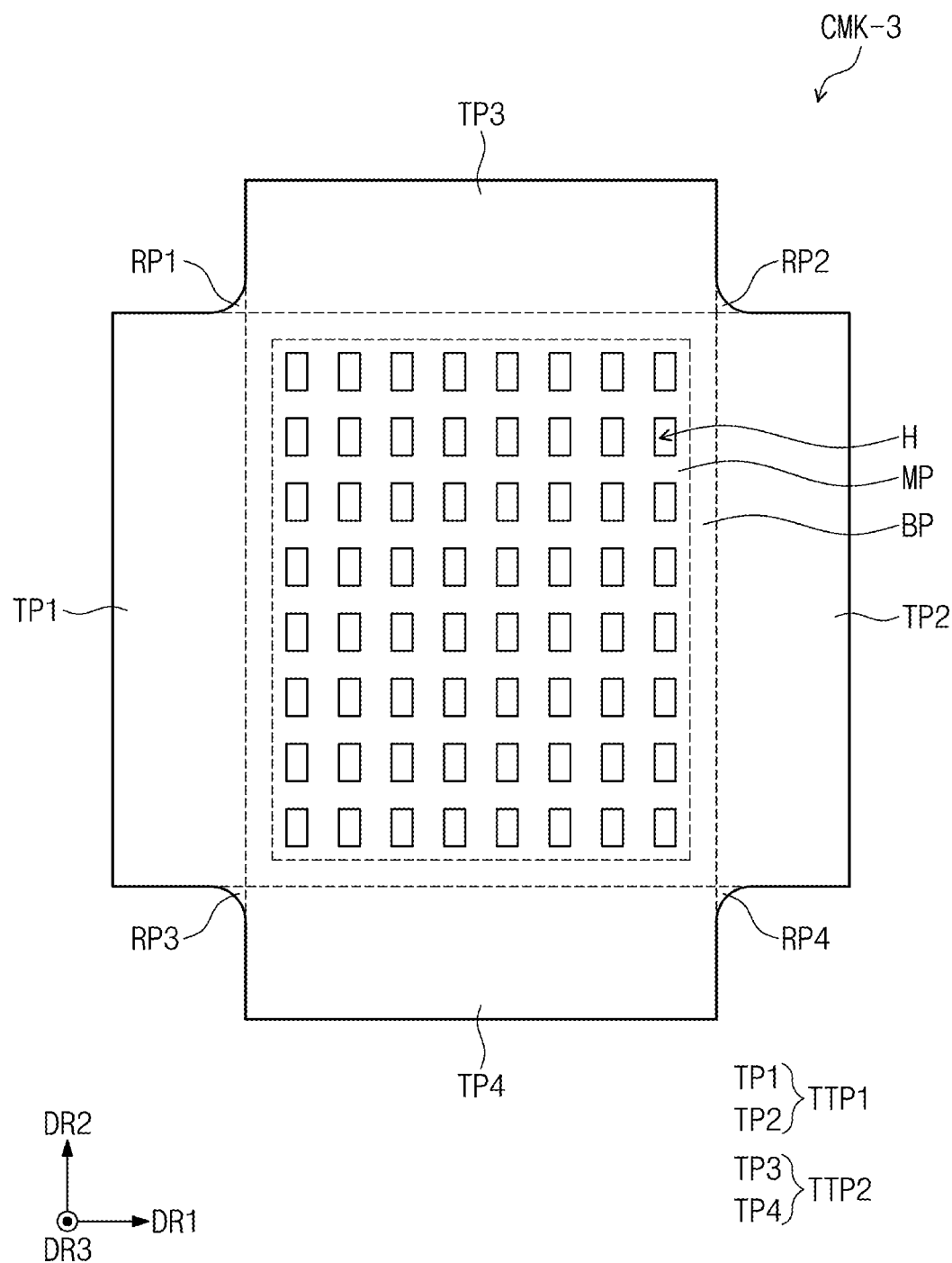

Referring to FIG. 8, another alternative embodiment of the cell mask CMK-3 may include round portions RP1, RP2, RP3, and RP4 defined at a corner at which a first tensile portion TTP1 meets a second tensile portion TTP2. Due to the round portions RP1, RP2, RP3, and RP4, the corner at which the first tensile portion TTP1 meets the second tensile portion TTP2 may be rounded, and the round portions RP1, RP2, RP3, and RP4 may connect the first tensile portion TTP1 to the second tensile portion TTP2. The round portions RP1, RP2, RP3, and RP4 may include a first round portion RP1 connecting a first side tensile portion TP1 and a third side tensile portion TP3, a second round portion RP2 connecting a second side tensile portion TP2 and the third side tensile portion TP3, a third round portion RP3 connecting the first side tensile portion TP1 and a fourth side tensile portion TP4, and a fourth round portion RP4 connecting the second side tensile portion TP2 and the fourth side tensile portion TP4.

In an embodiment, as shown in FIGS. 7 and 8, the cell mask CMK-2 or CMK-3 may include the recess portions GP1, GP2, GP3, and GP4 or the round portions RP1, RP2, RP3, and RP4, which are defined between the first tensile portion TTP1 and the second tensile portion TTP2. In such an embodiment, the cell masks CMK-2 and CMK-3 may be prevented from being damaged in a process of tensioning the tensile portions respectively disposed on the four sides to the direction being away from the mask main body MP to tension the cell masks CMK-2 and CMK-3 by reducing a stress of the portions between the first tensile portion TTP1 and the second tensile portion TTP2, where the stress due to the tension is concentrated.

Figure 9:
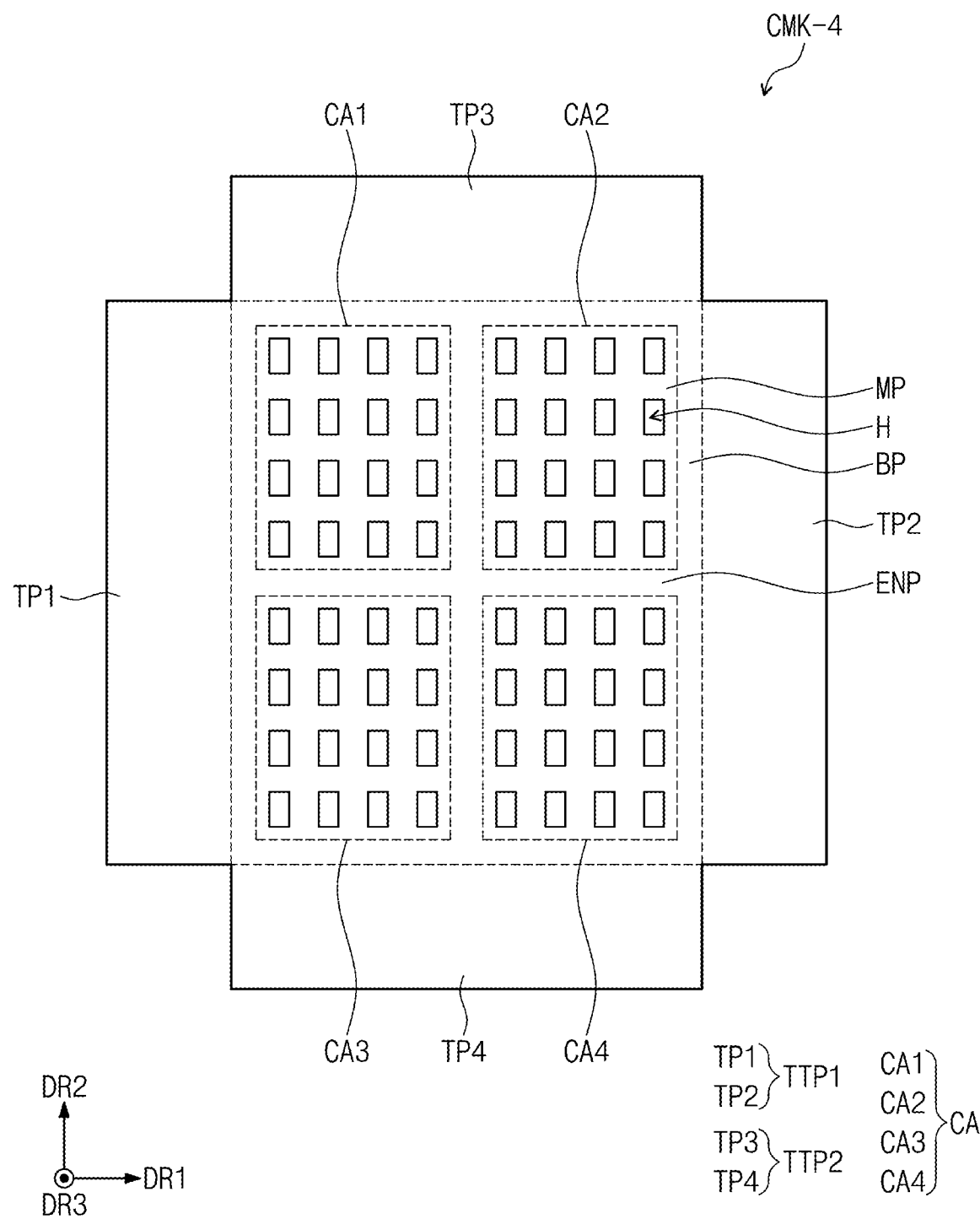

Referring to FIG. 9, another alternative embodiment of a mask main body MP of the cell mask CMK-4 may include a plurality of cell areas CA and an extension area ENP defined between the cell areas CA. A plurality of holes H may be defined through the mask main body MP along the third direction DR3 in each of the cell areas CA. The extension area ENP defined between the cell areas CA may be an area through which the holes H are not defined. The cell areas CA may be defined to respectively correspond to light emitting pattern layers EPP (refer to FIG. 13A) of a display panel manufactured using the mask. The extension area ENP may surround each of the cell areas CA. In such an embodiment, as shown in FIG. 9, the mask main body MP of the cell mask CMK-4 may include four cell areas, such as a first cell area CA1, a second cell area CA2, a third cell area CA3, and a fourth cell area CA4, which are defined therein and arranged in the first and second directions DR1 and DR2. However, the number and shape of the cell areas included in the cell mask CMK-4 may be variously modified depending on the patterned shape of the light emitting pattern layers of the display panel to be manufactured.

Figure 10:
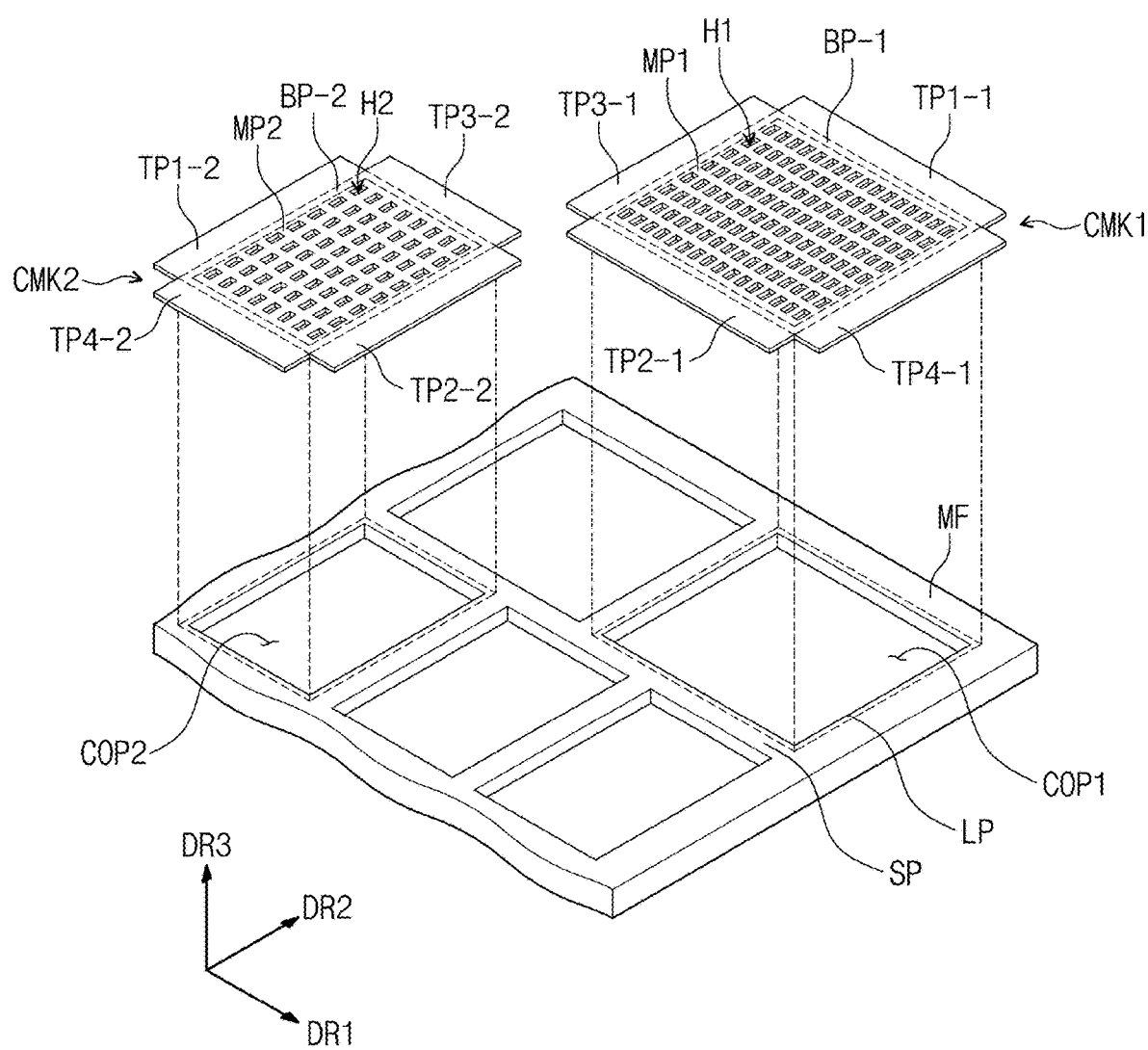
FIG. 10 is a perspective view showing a mask assembly according to an alternative embodiment of the disclosure.

FIG. 10 is a perspective view showing a mask assembly according to an alternative embodiment of the disclosure. The mask assembly shown in FIG. 10 includes cell openings and cell masks corresponding to the cell openings, which have different shapes from those of the mask assembly MKA shown in FIG. 3. In FIG. 10, the same reference numerals denote the same elements in FIG. 3, and thus any repetitive detailed descriptions of the same elements will be omitted.

Referring to FIG. 10, an embodiment of a mask frame MF may include the cell openings having different sizes from each other in a plane. The mask frame MF may include a first cell opening COP1 and a second cell opening COP2 having the size different from that of the first cell opening COP1. According to an embodiment, the second cell opening COP2 may have a size smaller than that of the first cell opening COP1 in a plane. In such an embodiment where the first cell opening COP1 and the second cell opening COP2 have different sizes and different shapes, edge portions LP respectively surrounding the first cell opening COP1 and the second cell opening COP2 may have different sizes and different shapes from each other.

Since the mask frame MF includes the first cell opening COP1 and the second cell opening COP2, the mask assembly may include a first cell mask CMK1 corresponding to the first cell opening COP1 and a second cell mask CMK2 corresponding to the second cell opening COP2. For the convenience of illustration and description, FIG. 10 shows the first cell mask CMK1 corresponding to the first cell opening COP1 among the first cell openings COP1 defined through the mask frame MF and the second cell mask CMK2 corresponding to the second cell opening COP2 among the second cell openings COP2 defined through the mask frame MF, however, the mask assembly may include a plurality of first cell masks CMK1 respectively corresponding to the first cell openings COP1 defined through the mask frame MF and a plurality of second masks CMK2 respectively corresponding to the second cell openings COP2 defined through the mask frame MF.

The first cell mask CMK1 may include a first mask main body MP1 corresponding to the shape of the first cell opening COP1, a first cell bonding portion BP-1 corresponding to a shape of the edge portion of the first cell opening COP1, and a plurality of tensile portions TP1-1, TP2-1, TP3-1, and TP4-1 disposed to respectively correspond to four sides of the first mask main body MP1, where a plurality of first holes H1 is defined through the first mask main body MP1. The second cell mask CMK2 may include a second mask main body MP2 corresponding to the shape of the second cell opening COP2, a second cell bonding portion BP-2 corresponding to a shape of the edge portion of the second cell opening COP2, and a plurality of tensile portions TP1-2, TP2-2, TP3-2, and TP4-2 disposed to respectively correspond to four sides of the second mask main body MP2, where a plurality of second holes H2 is defined through the second mask main body MP2.

An embodiment of the mask assembly may include the mask frame that includes the first and second cell openings having different sizes from each other in a plane and the first and second cell masks respectively corresponding to the first and second cell openings. In such an embodiment, the mask assembly may effectively prevent the four sides of the mask main body from being contracted in the process of tensioning the cell mask using the tensile portions disposed to respectively correspond to the four sides of the mask main body of each of the cell masks. In such an embodiment, the mask assembly includes the first and second cell masks respectively corresponding to the cell openings having different sizes in a plane, and thus, display panels having different cell sizes from each other may be manufactured by using a single mask assembly. Accordingly, a chamfering rate of the manufacturing process of the display panel, which is performed using an embodiment of the mask assembly, may increase, and thus, a manufacturing cost of the display panel may decrease.

Figure 11A:
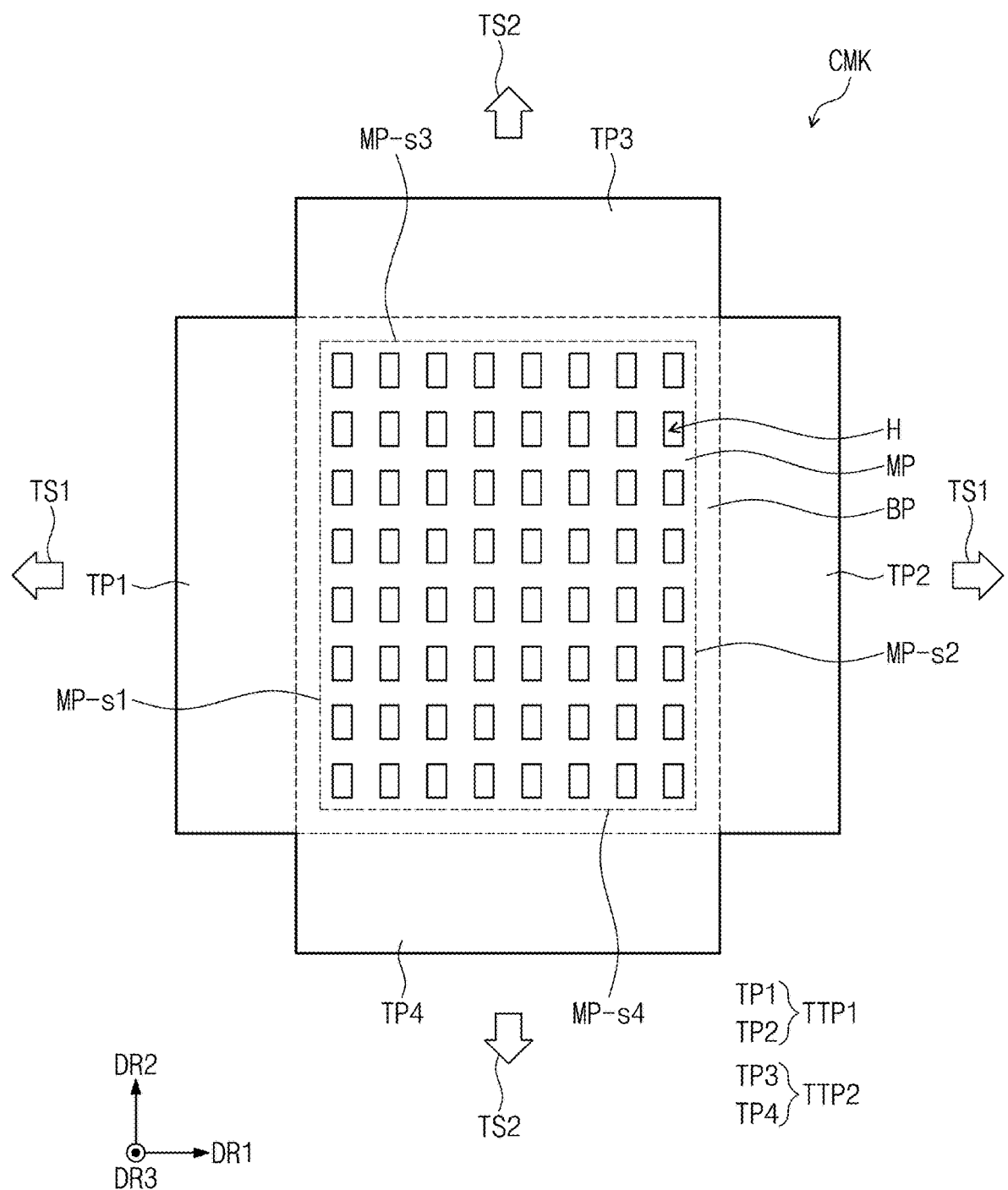
FIG. 11A is a plan view showing a process of a method of manufacturing a mask according to an embodiment of the disclosure.
Figure 11B:
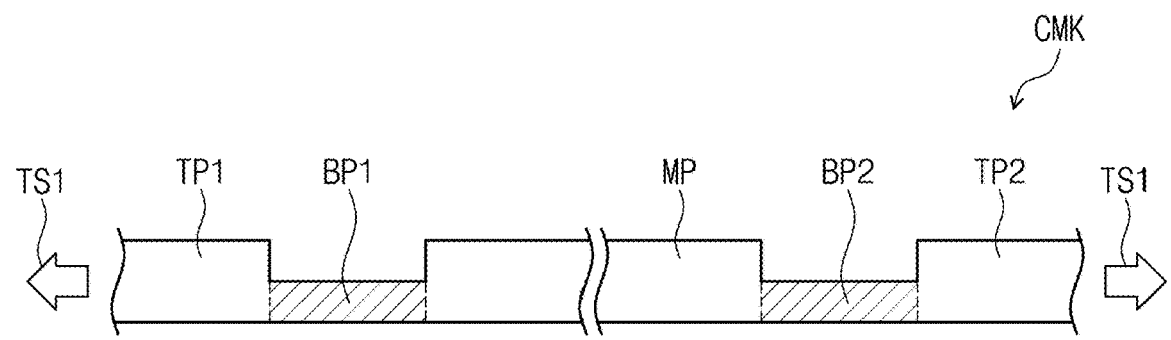
FIGS. 11B to 11D are cross-sectional views showing some processes of a method of manufacturing a mask according to an embodiment of the disclosure.
Figure 11B:
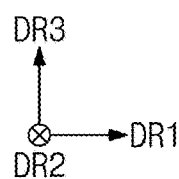
Figure 11C:
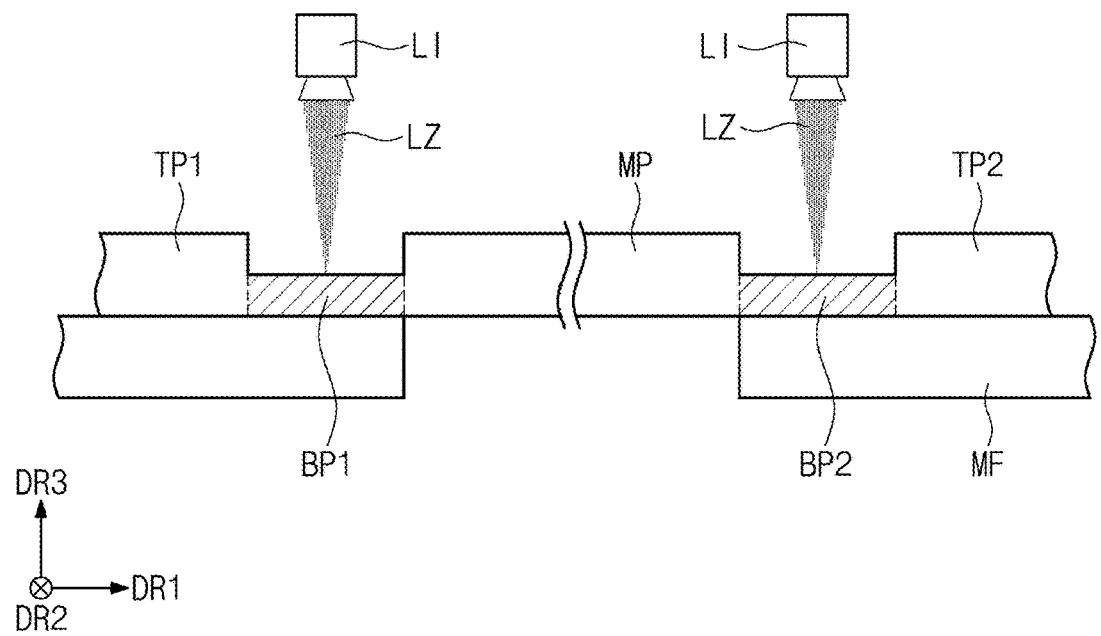
Figure 11D:
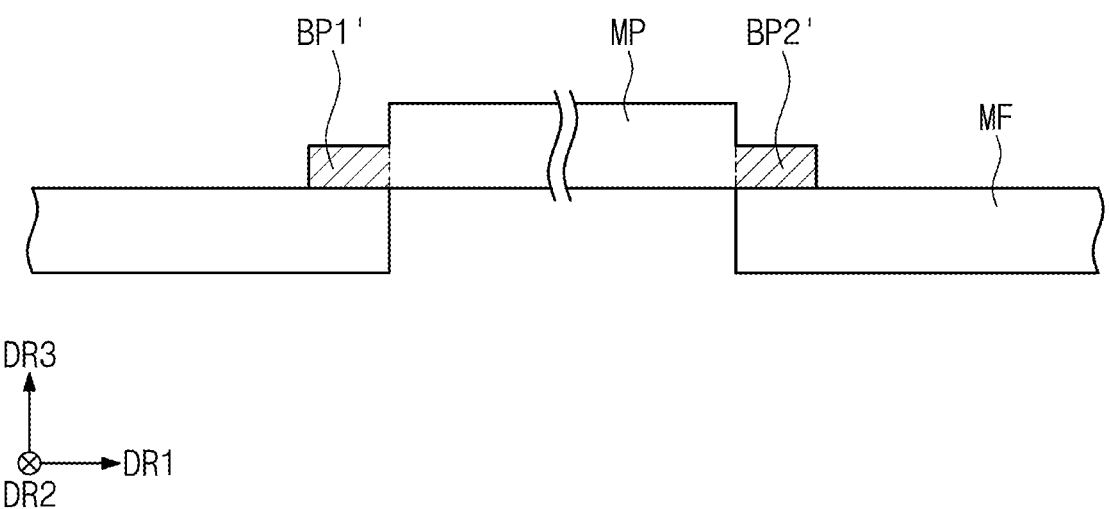
Figure 12:
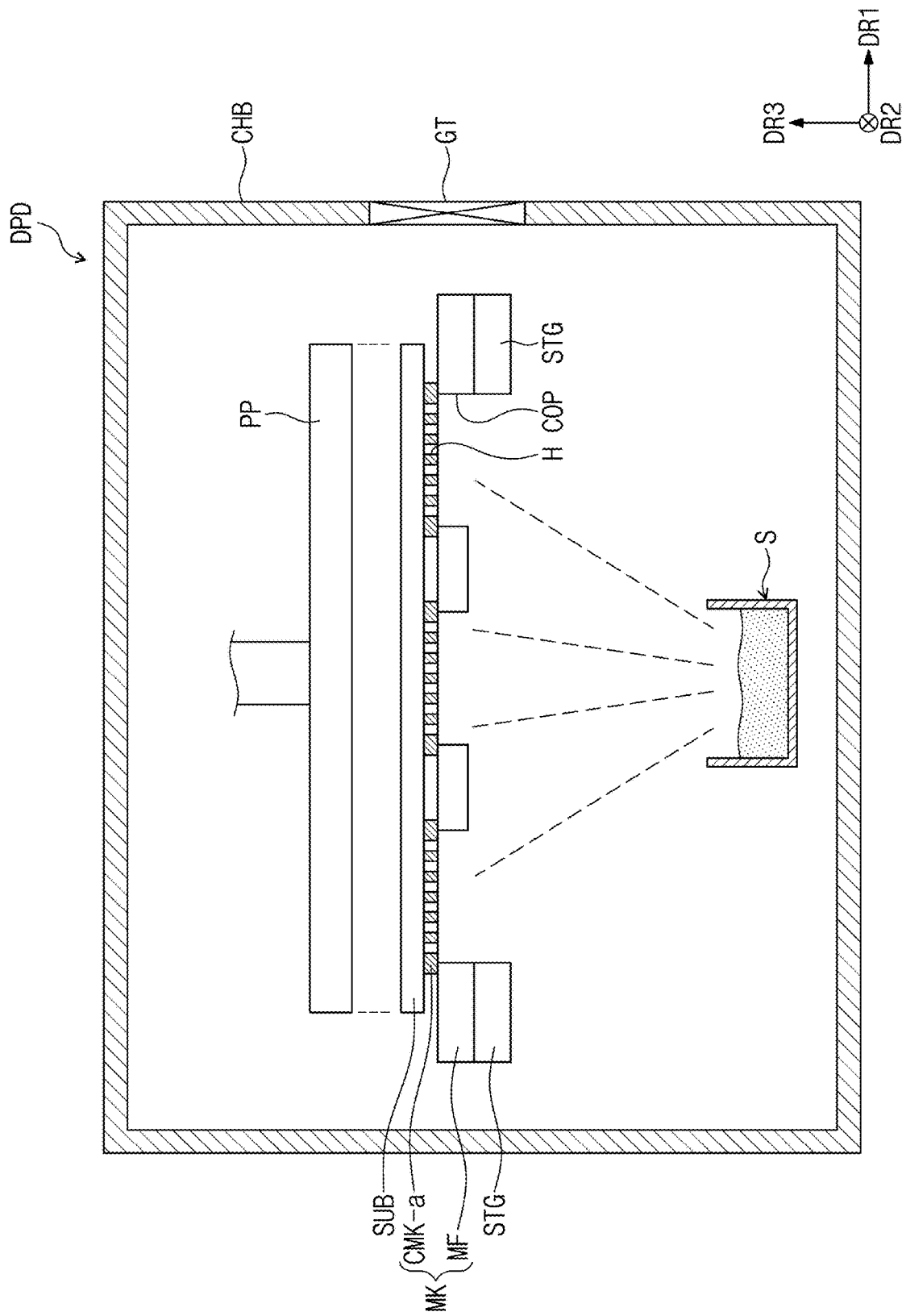
FIG. 12 is a cross-sectional view showing a deposition apparatus according to an embodiment of the disclosure.
Figure 13A:
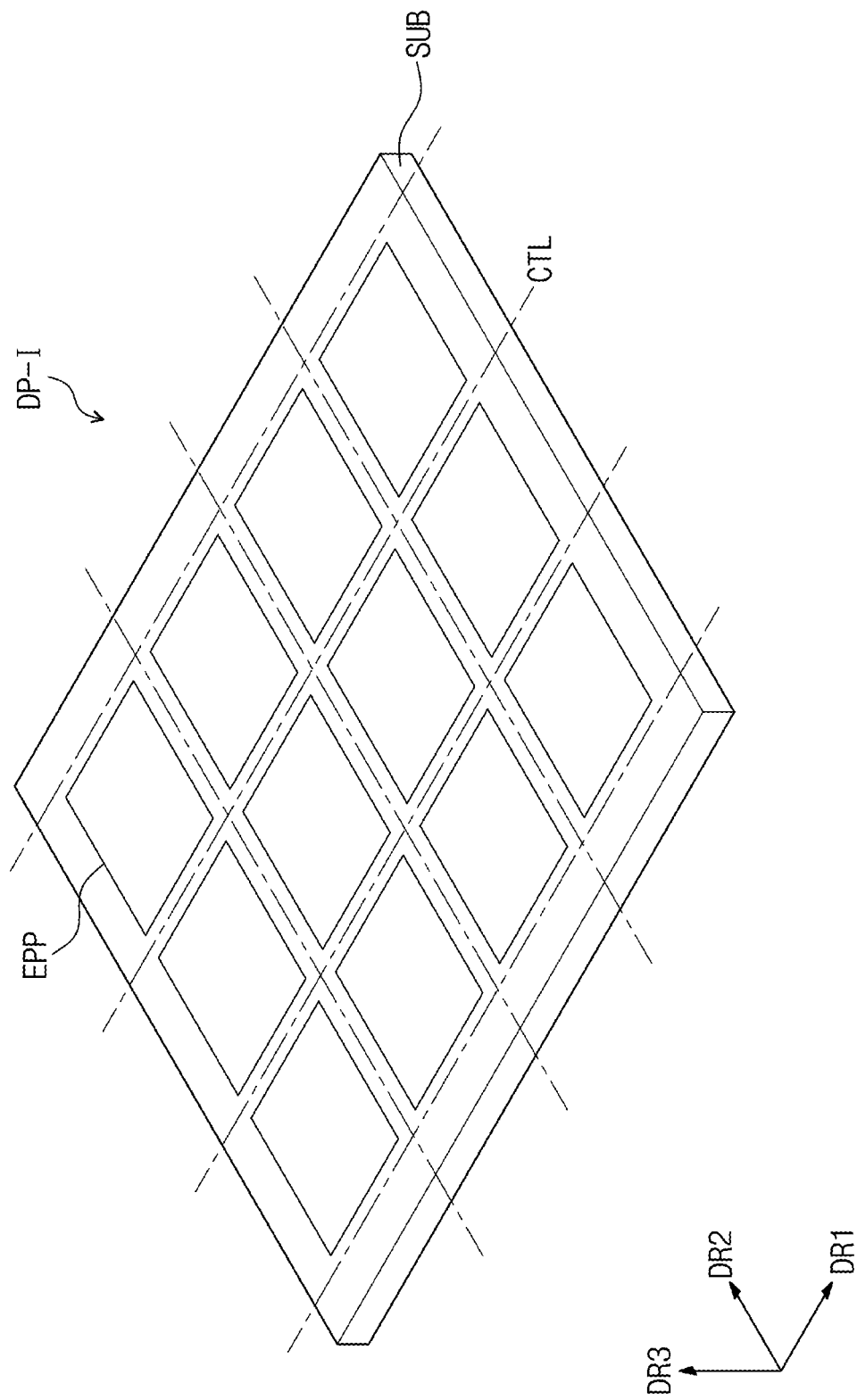
FIGS. 13A to 13C are perspective views showing a method of manufacturing a display panel according to an embodiment of the disclosure.
Figure 13B:
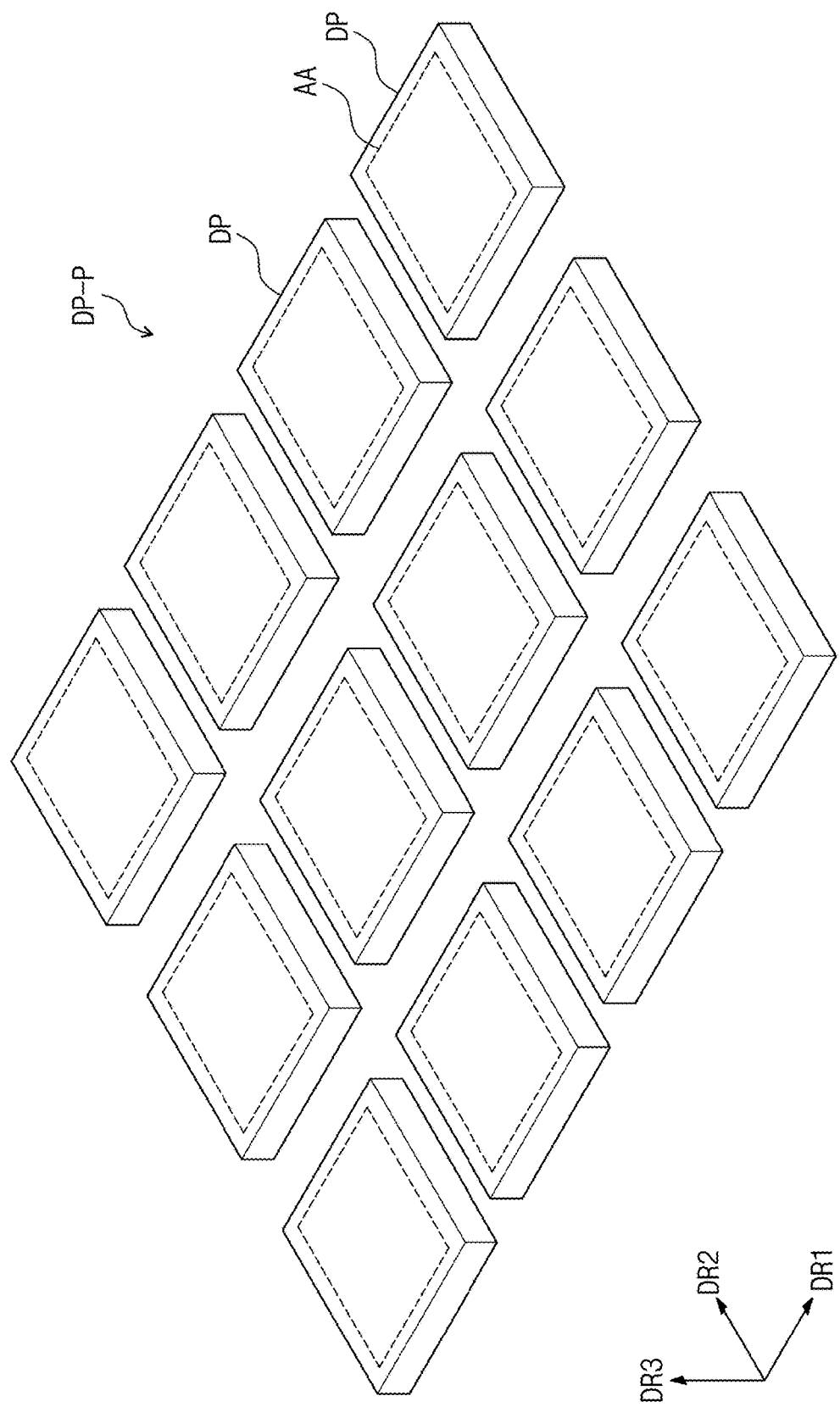
Figure 13C:
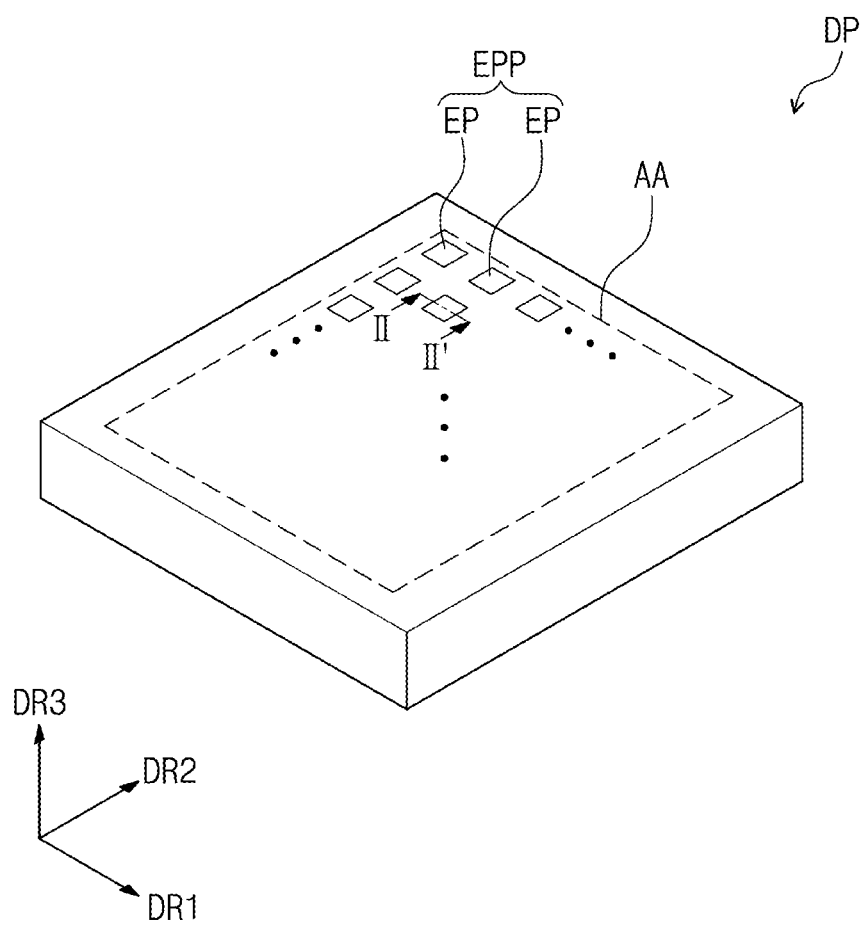

FIGS. 11A to 11D are views showing a method of manufacturing a mask according to an embodiment of the disclosure. FIG. 11A is a plan view showing a process of the manufacturing method of the mask according to an embodiment of the disclosure. FIGS. 11B to 11D are cross-sectional views showing some processes of the manufacturing method of the mask according to an embodiment of the disclosure. FIG. 12 is a cross-sectional view showing a deposition apparatus DPD according to an embodiment of the disclosure. FIGS. 13A to 13C are perspective views showing some processes of the manufacturing method of a display panel according to an embodiment of the disclosure.

Hereinafter, an embodiment of the manufacturing method of the display panel will be described with reference to FIGS. 11A to 11D, 12, and 13A to 13C. In FIGS. 11A to 11D, 12, and 13A to 13C, the same reference numerals denote the same elements in FIGS. 1 to 10, and thus, any repetitive detailed descriptions of the same elements will be omitted.

An embodiment of the manufacturing method of the display panel includes preparing a target substrate, forming a mask through which a plurality of holes is defined under the target substrate, forming a plurality of patterns corresponding to the holes, and removing the mask.

FIGS. 11A to 11D sequentially show processes of forming the mask using the mask assembly before plural masks are disposed under the target substrate in an embodiment of the manufacturing method of the display panel. In such an embodiment, the mask may be formed by bonding the mask frame MF to the cell masks CMK included in the mask assembly MKA.

Referring to FIGS. 3, 11A, and 11B, each of the cell masks CMK is tensioned before the cell masks CMK are placed on the mask frame MF in the process of forming the mask. The tensile portions TTP1 and TTP2 of the cell mask CMK may be held by the clamps, which are included in a tensioning apparatus, and pulled in the direction being away from the mask main body MP, and thus, the cell mask CMK may be tensioned. In such an embodiment, the cell mask CMK receives a first tensile force TS1 in a direction in which the first side MP-s1 and the second side MP-s2 of the mask main body MP face each other, i.e., the first direction DR1, and receives a second tensile force TS2 in a direction in which the third side MP-s3 and the fourth side MP-s4 of the mask main body MP face each other, i.e., the second direction DR2. The cell mask CMK may be tensioned through the tensioning process such that the mask main body MP and the bonding portion BP of each of the cell masks CMK respectively correspond to the cell opening COP and the edge portion LP. Each of the cell masks CMK may be tensioned in four directions by the tensile portions TTP1 and TTP2 disposed on the four sides of the mask main body MP, and thus, each of the cell mask CMK may be tensioned to correspond to the shape of each of the cell openings without causing the contraction of the four sides. In such an embodiment, as each of the cell masks CMK receives the first and second tensile forces TS1 and TS2 through the four sides, the mask main body MP may receive the first tensile force TS1 in the first direction DR1 and the direction opposite to the first direction DR1 and may receive the second tensile force TS2 in the second direction DR2 and the direction opposite to the second direction DR2 in a state in which the cell mask CMK is bonded to the mask MK through the bonding process to form the unit mask CMK-a (refer to FIG. 1).

Referring to FIGS. 3, 11C, and 11D, the tensioned cell mask CMK is disposed or placed on or to overlap the corresponding cell opening COP, and then, the bonding portions BP1 and BP2 may be bonded to the edge portion LP of the mask frame MF through a process of radiating a laser beam LZ. FIG. 11C show only the first and second bonding portions BP1 and BP2' for convenience of illustration, however, the third and fourth bonding portions BP3 and BP4 may be bonded to the edge portion LP of the mask frame MF through the radiation process of the laser beam LZ. A laser irradiation unit LI may irradiate the laser beam LZ along an imaginary laser processing line defined between the bonding portions BP1 and BP2 and the edge portion LP to bond the mask frame MF to the cell mask CMK. A portion of at least one of the bonding portions BP1 and BP2 and the edge portion LP may be melted by radiating the laser beam LZ to the portion, and thus, the bonding portions BP1 and BP2 and the edge portion LP may be bonded to each other. Although not shown in figures, the tensile portions TTP1 and TTP2 included in the cell mask CMK may be processed to have a shape bent upward in the process of tensioning the cell mask, and thus, the tensile portions TTP1 and TTP2 may avoid interference with the cell mask CMK adjacent thereto in the bonding process.

The tensile portions TTP1 and TTP2 included in the cell masks CMK may be removed after each of the cell masks CMK is bonded to the mask frame MF on the corresponding cell opening COP. In an embodiment, the tensile portions TTP1 and TTP2 may be removed in the process of radiating the laser beam LZ for the bonding process. Alternatively, the tensile portions TTP1 and TTP2 may be removed through a process of radiating a separate additional laser beam after the mask frame MF is bonded to the cell mask CMK through the process of radiating the laser beam LZ. The cell mask CMK, from which the tensile portions TTP1 and TTP2 are removed, may be referred to as the unit mask CMK-a (refer to FIG. 1).

Portions of the bonding portions BP1 and BP2 may be removed during the process of removing the tensile portions TTP1 and TTP2 through the process of irradiating the laser beam LZ. The remaining portions of the bonding portions BP1 and BP2, which are bonded to the mask frame MF through the process of radiating the laser beam LZ after the portions of the bonding portions BP1 and BP2 and the tensile portions TTP1 and TTP2 are removed, may define the bonding portions BP1' and BP2' of the unit mask CMK-a.

The bonding portions BP1' and BP2' of the unit mask CMK-a may include a metal oxide obtained by oxidizing a metal included in the bonding portions BP1 and BP2 of the cell mask CMK through the radiation process of the laser beam LZ. In an embodiment, the bonding portions BP1 and BP2 of the cell mask CMK may include Invar, and the bonding portions BP1' and BP2' of the unit mask CMK-a may include an oxide of Invar after the radiation process of the laser beam LZ.

Referring to FIG. 12, an embodiment of the deposition apparatus DPD may include a chamber CHB, a deposition source S, a stage STG, a moving plate PP, and a mask MK.

The chamber CHB may provide a confined space. The deposition source S, the stage STG, the moving plate PP, and the mask MK may be disposed in the chamber CHB. The chamber CHB may include a gate GT. The chamber CHB may be opened and closed by the gate GT. A target substrate SUB may loaded into or unloaded from the chamber CHB through the gate GT defined through the chamber CHB.

In an embodiment, the deposition source S may include a deposition material. In such an embodiment, the deposition material is a material that is capable of being sublimated or vaporized and may include at least one selected from an inorganic material, a metal material, and an organic material. Hereinafter, for convenience of description, an embodiment where the deposition source S including an organic material is used to manufacture an organic light emitting device OLED (refer to FIG. 14) will be described.

The stage STG may be disposed above the deposition source S. The mask MK may be disposed on the stage STG. The mask MK may be disposed after being manufactured through the above-mentioned mask manufacturing process. The mask MK may face the deposition source S. The stage STG may be disposed to overlap the mask frame MF of the mask MK and may support the mask MK. The stage STG may not overlap the cell opening COP of the mask frame MF. That is, the stage STG may be disposed outside a path through which the deposition material is supplied to the target substrate SUB from the deposition source S.

The target substrate SUB may be disposed on the mask MK. The deposition material may be deposited on the target substrate SUB through the holes H defined through each unit mask CMK-a to form a plurality of patterns on the target substrate SUB. In such an embodiment, the patterns formed by the deposition material may be the light emitting pattern.

The moving plate PP may align the target substrate SUB on the mask MK. The moving plate PP may move up and down or left and right. The moving plate PP may include a member to move the target substrate SUB and a member to hold the target substrate SUB.

Referring to FIGS. 1, 12, and 13A, in such an embodiment, the mask MK may be removed after the deposition material is deposited on the target substrate SUB by the deposition apparatus DPD. An initial substrate DP-I from which the mask MK is removed may be the target substrate SUB on which the light emitting pattern layers EPP are formed. The light emitting pattern layers EPP may be formed to respectively correspond to the unit masks CMK-a of the mask MK. Each of the light emitting pattern layers EPP may include a plurality of light emitting patterns (not shown).

Referring to FIGS. 13A and 13B, the substrate DP-I from which the mask MK is removed is cut along cutting lines CTL defined in the initial substrate DP-I from which the mask MK is removed, and the substrate DP-I is divided into a plurality of panels DP-P. Each of the panels DP-P may form the display panel DP.

According to an embodiment of the disclosure, the display panels DP may be formed by patterning the target substrate SUB. In such an embodiment, as the mask used to manufacture the display panel is manufactured using the mask assembly including the cell masks, each being tensioned in four directions, the processes of manufacturing the large-area mask to be used to form the plural display panels DP may be performed. Accordingly, a process time may be shortened, and a process cost may be reduced. However, according to an alternative embodiment, a single display panel DP may be formed from the target substrate SUB according to the size of the display panel DP.

Referring to FIG. 13C, an embodiment of the display panel DP may include an active area AA. The active area AA may include a plurality of pixels PX. The active area AA may correspond to the area in which the light emitting pattern layers EPP are disposed, and the light emitting patterns EP may respectively correspond to the pixels PX. Each of the light emitting patterns EP may be formed to respectively correspond to the holes H defined through the unit mask CMK-a included in the mask MK.

Figure 14:
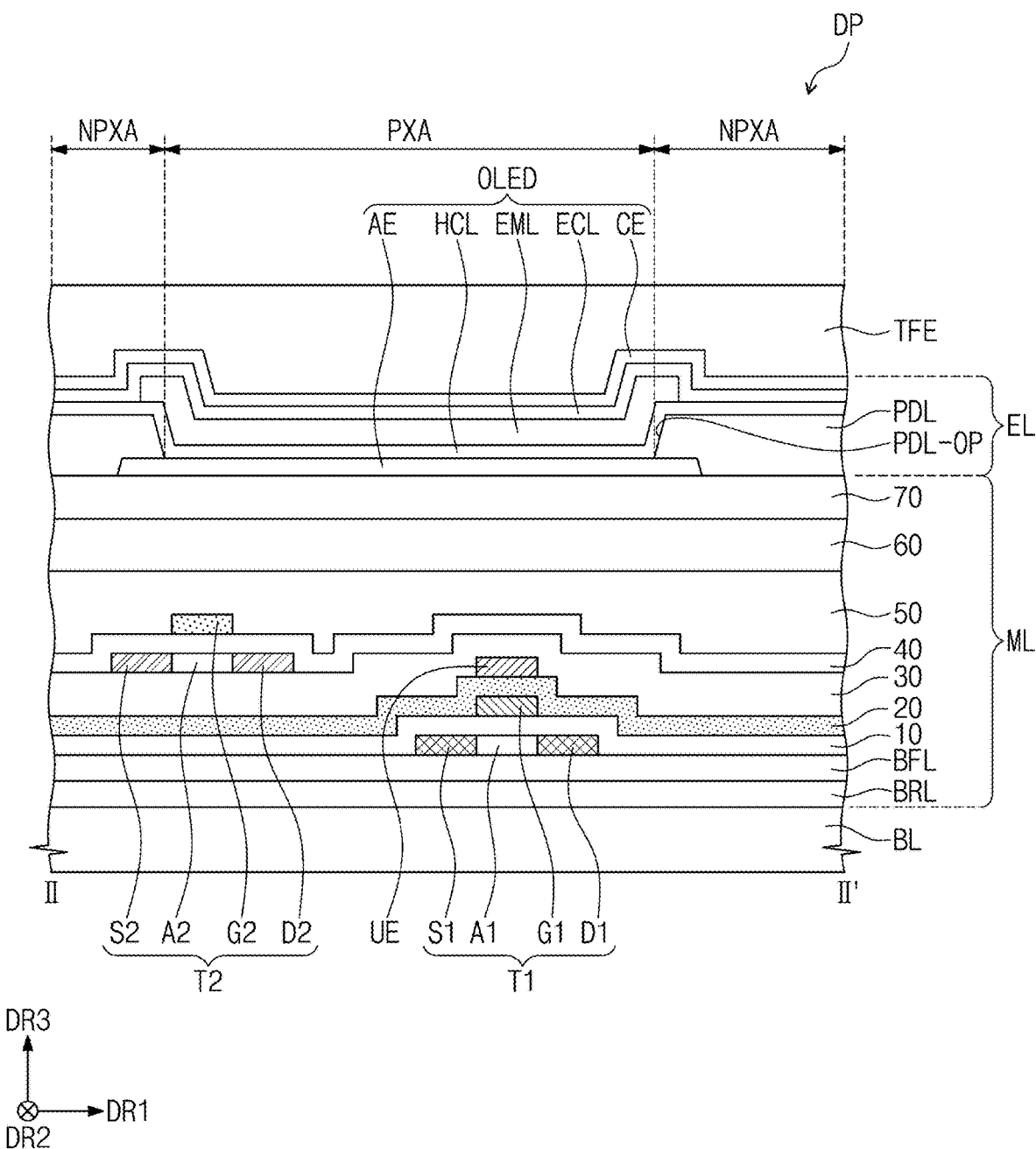
FIG. 14 is a cross-sectional view showing a display panel according to an embodiment of the disclosure.

FIG. 14 is a cross-sectional view showing the display panel DP according to an embodiment of the disclosure. FIG. 14 shows a cross-section taken along line II-II' of FIG. 13A to show a portion of the display panel.

Referring to FIG. 14, an embodiment of the display panel DP may be, but not limited to, a light emitting type display panel. FIG. 14 shows the cross-section of one pixel with two transistors T1 and T2 and the organic light emitting device OLED among the pixels.

In an embodiment, as shown in FIG. 14, the display panel DP may include a base layer BL, a circuit element layer ML disposed on the base layer BL, a display element layer EL disposed on the circuit element layer ML, and an insulating layer TFE (hereinafter, referred to as an "upper insulating layer") disposed on the display element layer EL.

The base layer BL may include a synthetic resin layer. The base layer BL may be formed by forming a synthetic resin layer on a support substrate used to manufacture the display panel DP, forming a conductive layer and an insulating layer on the synthetic resin layer, and removing the support substrate.

The circuit element layer ML may include an insulating layer and a circuit element. The circuit element may include a signal line and a pixel driving circuit. The circuit element layer ML may be formed through processes of forming an insulating layer, a semiconductor layer, and a conductive layer, such as a coating process and a deposition process, and processes of patterning the insulating layer, the semiconductor layer, and the conductive layer, such as a photolithography process.

In an embodiment, the circuit element layer ML may include a buffer layer BFL, a barrier layer BRL, and first, second, third, fourth, fifth, sixth, and seventh insulating layers 10, 20, 30, 40, 50, 60, and 70. The buffer layer BFL, the barrier layer BRL, and the first, second, third, fourth, fifth, sixth, and seventh insulating layers 10, 20, 30, 40, 50, 60, and 70 may include an inorganic layer or an organic layer. In an embodiment, the buffer layer BFL and the barrier layer BRL may include the inorganic layer. In an embodiment, at least one selected from the fifth to seventh insulating layers 50 to 70 may include the organic layer.

FIG. 14 shows an arrangement relationship of a first active A1, a second active A2, a first gate G1, a second gate G2, a first source S1, a second source S2, a first drain D1, and a second drain D2, which form first and second transistors T1 and T2. In an embodiment, the first active A1 and the second active A2 may include different materials from each other. The first active A1 may include a polysilicon semiconductor, and the second active A2 may include a metal oxide semiconductor. The first source S1 and the first drain D1 may have a doping concentration greater than that of the first active A1 and may serve as an electrode. The second source S2 and the second drain D2 may be obtained by reducing the metal oxide semiconductor and may serve as an electrode. In an embodiment, as shown in FIG. 14, an upper electrode UE may be disposed on the second insulating layer 20, such that a capacitor may be defined by the upper electrode UE with the first gate G1.

According to an alternative embodiment of the disclosure, the first and second actives A1 and A2 may include the same semiconductor material as each other, and in such an embodiment, a stack structure of the circuit element layer ML may be further simplified.

In an embodiment, the display element layer EL may include a pixel definition layer PDL and the organic light emitting device OLED. The organic light emitting device OLED may be an organic light emitting diode or a quantum dot light emitting diode. An anode AE may be disposed on the seventh insulating layer 70. At least a portion of the anode AE may be exposed through a pixel opening PDL-OP of the pixel definition layer PDL. A light emitting area PXA may be defined by the pixel opening PDL-OP of the pixel definition layer PDL. A non-light-emitting area NPXA may surround the light emitting area PXA.

A hole control layer HCL and an electron control layer ECL may be commonly disposed in the light emitting area PXA and the non-light-emitting area NPXA. A light emitting layer EML may include a light emitting material and may be provided in a pattern shape to correspond to the pixel opening PDL-OP. The light emitting layer EML may be deposited through a different method from that used to form the hole control layer HCL and the electron control layer ECL. The hole control layer HCL and the electron control layer ECL may be commonly formed in the pixels using an open mask. The light emitting layer EML may be formed in the pattern shape to correspond to the pixel opening PDL-OP using an embodiment of the mask described above, but not being limited thereto or thereby. In an embodiment, the hole control layer HCL and the electron control layer ECL may be also formed in the pattern shape as the light emitting layer EML to correspond to the pixel opening PDL-OP using the mask.

A cathode CE may be disposed on the electron control layer ECL. The upper insulating layer TFE may be disposed on the cathode CE. The upper insulating layer TFE may be a thin film encapsulation layer to encapsulate the display element layer EL. The upper insulating layer TFE may include a plurality of thin films. The thin films may include an inorganic layer and an organic layer. The upper insulating layer TFE may include an insulating layer to encapsulate the display element layer EL and a plurality of insulating layers to improve a light emission efficiency.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A mask assembly comprising:
a mask frame through which a plurality of cell openings is defined; and
a plurality of cell masks disposed to respectively correspond to the cell openings,
wherein each of the cell masks comprises:
a mask main body substantially parallel to a plane defined by a first direction and a second direction crossing the first direction, wherein a plurality of holes is defined through the mask main body;
a bonding portion disposed along an edge of the mask main body, wherein at least a portion of the bonding portion has a thickness smaller than a thickness of the mask main body; and
a tensile portion extending from the bonding portion and disposed spaced apart from the mask main body,
wherein the tensile portion comprises:
first tensile portions spaced apart from each other in the first direction and disposed at opposite sides of the mask main body, respectively; and
second tensile portions spaced apart from each other in the second direction and disposed at other opposite sides of the mask main body, respectively.

2. The mask assembly of claim 1, wherein
the first tensile portions comprise first and second side tensile portions disposed at the opposite sides of the mask main body, which face each other in the first direction, and the second tensile portions comprise third and fourth side tensile portions disposed at the opposite sides of the mask main body, which face each other in the second direction.

3. The mask assembly of claim 1, wherein the tensile portion comprises:
a plurality of convex portions protruding to a direction being away from the mask main body; and
a concave portion defined between the convex portions and concave toward the mask main body.

4. The mask assembly of claim 1, wherein each of the cell masks comprises a recess portion defined between the first tensile portions and the second tensile portions and recessed toward the mask main body.

5. The mask assembly of claim 1, wherein each of the cell masks comprises a round portion connecting the first tensile portions to the second tensile portions.

6. The mask assembly of claim 1, wherein the cell openings of the mask frame comprise a first cell opening, and a second cell opening having a size different from a size of the first cell opening when viewed in a plane.

7. The mask assembly of claim 6, wherein the cell masks comprise:
a first cell mask having an area corresponding to the first cell opening in a plane; and
a second cell mask having an area corresponding to the second cell opening in a plane.

8. The mask assembly of claim 1, wherein the thickness of the at least one portion of the bonding portion is smaller than a thickness of the tensile portion.

9. The mask assembly of claim 1, wherein the bonding portion comprises a plurality of half-etching patterns defining the at least one portion.

10. The mask assembly of claim 1, wherein each of the cell masks comprises:
a plurality of cell areas, wherein the holes are defined through each of the cell areas; and
an extension area defined between the cell areas.

11. The mask assembly of claim 1, wherein the mask frame comprises a bonding area defined along an edge of the cell openings.

12. The mask assembly of claim 1, wherein the cell openings are arranged in at least one direction selected from the first and second directions to be spaced apart from each other.

13. The mask assembly of claim 1, wherein the mask frame comprises a support area defined between the cell openings.

14. A mask comprising:
a mask frame, through which a plurality of cell openings is defined; and
a plurality of unit masks bonded to the mask frame to respectively correspond to the cell openings,
wherein each of the unit masks comprises:
a mask main body including first and second sides facing each other in a first direction and extending in a second direction crossing the first direction and third and fourth sides facing each other in the second direction and extending in the first direction, wherein a plurality of holes is defined through the mask main body; and
a bonding portion defined along an edge of the mask main body,
wherein the mask main body of each of the unit masks receives a first tensile force in the first direction and a second tensile force in the second direction, and wherein at least a portion of the bonding portion has a thickness smaller than a thickness of the mask main body.

15. The mask of claim 14, wherein
the bonding portion comprises a first bonding portion disposed adjacent to the first side, a second bonding portion disposed adjacent to the second side, a third bonding portion disposed adjacent to the third side, and a fourth bonding portion disposed adjacent to the fourth side, and
each of the first, second, third, and fourth bonding portions is bonded to the mask frame.

16. The mask of claim 15, wherein each of the first, second, third, and fourth bonding portions comprises a metal oxide.

17. A method of manufacturing a display panel, the method comprising:
preparing a target substrate;
forming a mask, through which a plurality of holes is defined, to place the mask under the target substrate;
forming a plurality of patterns corresponding to the holes; and
removing the mask,
wherein the forming the mask comprising:
  preparing a mask frame through which a plurality of cell openings is defined; and
  coupling cell masks to respectively correspond to the cell openings,
  wherein each of the cell masks comprises:
    a mask main body substantially parallel to a plane defined by a first direction and a second direction crossing the first direction, wherein the holes are defined through the mask main body;
    a bonding portion disposed along an edge of the mask main body, wherein at least a portion of the bonding portion has a thickness smaller than a thickness of the mask main body; and
    a tensile portion extending from the bonding portion and disposed spaced apart from the mask main body,
    wherein the tensile portion comprises:
      first tensile portions spaced apart from each other in the first direction and disposed at opposite sides of the mask main body, respectively; and
      second tensile portions spaced apart from each other in the second direction and disposed at other opposite sides of the mask main body, respectively.

18. The method of claim 17, wherein the coupling the cell masks comprises:
disposing the cell masks respectively corresponding to the cell openings;
radiating a laser beam to the bonding portion of each of the cell masks to bond the mask frame to the cell masks; and
removing the tensile portion.

19. The method of claim 18, wherein the coupling the cell masks further comprises tensioning the cell masks to correspond to the cell openings before disposing the cell masks.

20. The method of claim 18, wherein
the mask frame comprises a bonding area defined along an edge of each of the cell openings, and
the laser beam is radiated between the bonding portion and the bonding area in the bonding of the mask frame and the cell masks.

21. The method of claim 17, wherein
the cell openings comprise a first cell opening and a second cell opening having a size different from a size of the first cell opening in a plane, and
the cell masks comprise a first cell mask coupled to correspond to the first cell opening and a second cell mask coupled to correspond to the second cell opening.

22. The method of claim 17, wherein the patterns are light emitting patterns comprising a light emitting material.

* * * * *